United States Patent
Furuya et al.

(10) Patent No.: US 7,741,008 B2
(45) Date of Patent: *Jun. 22, 2010

(54) POSITIVE RESIST COMPOSITION, POSITIVE RESIST COMPOSITION FOR THERMAL FLOW, AND RESIST PATTERN FORMING METHOD

(75) Inventors: Sanae Furuya, Kawasaki (JP); Hideo Hada, Kawasaki (JP); Yusuke Nakagawa, Kawasaki (JP); Akiyoshi Yamazaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 110 days.

This patent is subject to a terminal disclaimer.

(21) Appl. No.: 12/089,681

(22) PCT Filed: Oct. 17, 2006

(86) PCT No.: PCT/JP2006/320674

§ 371 (c)(1),
(2), (4) Date: Apr. 9, 2008

(87) PCT Pub. No.: WO2007/046388

PCT Pub. Date: Apr. 26, 2007

(65) Prior Publication Data

US 2009/0142696 A1    Jun. 4, 2009

(30) Foreign Application Priority Data

Oct. 21, 2005    (JP) .............................. 2005-307688

(51) Int. Cl.
  G03F 7/004    (2006.01)
  G03F 7/30    (2006.01)
(52) U.S. Cl. .................. 430/270.1; 430/326; 430/910
(58) Field of Classification Search .............. 430/270.1, 430/326, 910
See application file for complete search history.

(56) References Cited

U.S. PATENT DOCUMENTS

| | | | |
|---|---|---|---|
| 5,945,517 | A | 8/1999 | Nitta et al. |
| 6,180,313 | B1 | 1/2001 | Yukawa et al. |
| 6,440,262 | B1 | 8/2002 | Minami et al. |
| 6,803,176 | B2 | 10/2004 | Choi et al. |
| 7,074,543 | B2 * | 7/2006 | Iwai et al. ................. 430/270.1 |
| 2002/0045130 | A1 | 4/2002 | Nitta et al. |
| 2005/0100819 | A1 * | 5/2005 | Fuji et al. ................. 430/270.1 |

FOREIGN PATENT DOCUMENTS

| | | |
|---|---|---|
| JP | H09-208554 | 8/1997 |
| JP | H11-35551 | 2/1999 |
| JP | H 11-35552 | 2/1999 |
| JP | H11-35573 | 2/1999 |
| JP | H11-322707 | 11/1999 |
| JP | 2000-188250 | 7/2000 |
| JP | 2000-356850 | 12/2000 |
| JP | 2002-72480 | 3/2002 |
| JP | 2002-184763 | 6/2002 |
| JP | 2003-241385 | 8/2003 |
| JP | 2005-255742 | 9/2005 |
| WO | WO 2004/074242 A2 | 9/2004 |

OTHER PUBLICATIONS

International Search Report in connection with corresponding PCT application No. PCT/JP2006/320674, dated Nov. 21, 2006.

* cited by examiner

*Primary Examiner*—John S Chu
(74) *Attorney, Agent, or Firm*—Knobbe, Martens, Olson & Bear, LLP

(57) ABSTRACT

Disclosed is a positive resist composition comprising a resin component (A) and an acid generator component (B), wherein the component (A) contains a polymer compound (A1) containing a structural unit (a0) represented by formula (a0) shown below and a structural unit (a2) derived from an acrylate ester containing a lactone-containing cyclic group:

(a0)

$$\begin{array}{c} \text{H}_2\text{C} \\ | \\ \text{C} \\ \| \\ \text{O} \end{array} \begin{array}{c} \text{R} \\ | \\ \\ \text{O} \end{array}$$

$$(\text{CH}_2)_c$$
$$Y^1 \text{—}[(\text{CH}_2)_e\text{—}OZ]_a$$
$$(\text{CH}_2)_d$$
$$|$$
$$OH \quad ]_b$$

(wherein R represents a hydrogen atom, a halogen atom, a lower alkyl group, or a halogenated lower alkyl group; $Y^1$ represents an aliphatic cyclic group; Z represents an acid dissociable, dissolution inhibiting group containing a tertiary alkyl group; a represents an integer from 1 to 3, b represents an integer from 0 to 2, and a+b=1 to 3; and c, d and e each represents, independently, an integer from 0 to 3).

8 Claims, 1 Drawing Sheet

POSITIVE RESIST COMPOSITION, POSITIVE RESIST COMPOSITION FOR THERMAL FLOW, AND RESIST PATTERN FORMING METHOD

RELATED APPLICATIONS

This application is the U.S. National Phase filing under 35 U.S.C. §371 of PCT/JP2006/320674, filed Oct. 17, 2006, which designated the United States and was published in a language other than English, which claims priority under 35 U.S.C. §119(a)-(d) to Japanese Patent Application No. 2005-307688, filed Oct. 21, 2005. The contents of these applications are incorporated herein by reference in their entireties.

TECHNICAL FIELD

The present invention relates to a positive resist composition, a positive resist composition for thermal flow, and a method for forming a resist pattern.

BACKGROUND ART

Lithographic techniques include the steps of forming a resist film made of a resist material on a substrate, selectively exposing the resist film to radiation such as light or an electron beam through a mask with a predetermined pattern formed thereon, and developing the resist film to form a resist pattern having a predetermined shape on the resist film.

A resist material having characteristics which cause the exposed portions to become soluble in a developing solution is referred to as a positive resist material, whereas, a resist material having characteristics which cause the exposed portions to become insoluble in a developing solution is referred to as a negative resist material.

In recent years, in the production of semiconductor elements and liquid crystal display elements, advances in lithography techniques have lead to rapid progress in the field of miniaturization.

Typically, these miniaturization techniques involve shortening the wavelength of the exposure light source. Specifically, ultraviolet radiation such as g-line and i-line radiation has conventionally been used, but nowadays KrF excimer lasers and ArF excimer lasers have begun to be introduced in the mass production of semiconductor elements. Also, radiation having a shorter wavelength than that of these excimer lasers, for example, $F_2$ excimer lasers, electron beams, EUV (extreme ultraviolet), and X-rays are also being examined.

It is required that the resist material has sensitivity to these exposure light sources, and lithographic characteristics such as resolution capable of reproducing a pattern of minute dimensions. As the resist material which satisfies these requirements, a chemically amplified photoresist containing a base resin which exhibits changeable alkali solubility under the action of an acid, and an acid generator component which generates an acid upon exposure is used. For example, a positive chemically amplified photoresist contains, as the base resin, a resin which exhibits increased alkali solubility under the action of an acid and an acid generator, and when an acid is generated from the acid generator upon exposure in the formation of a resist pattern, the exposed portions are changed to an alkali-soluble state.

As the base resin of the chemically amplified photoresist, polyhydroxystyrene (PHS) having high transparency to a KrF excimer laser (248 nm) and a resin (PHS-based resin) containing a hydroxyl group protected with an acid dissociable, dissolution inhibiting group have conventionally been used.

However, the PHS-based resin contains an aromatic ring such as a benzene ring and is therefore insufficient in transparency to light having a wavelength shorter than 248 nm, for example, light having a wavelength of 193 nm. Therefore, a chemically amplified photoresist containing the PHS-based resin as a base resin component has a drawback such as low resolution in a process using light having a wavelength of 193 nm.

Therefore, as the base resin used in ArF excimer laser lithography, a resin (acrylic resin) containing a structural unit derived from a (meth)acrylate ester in the main chain (see, for example, Patent Document 1) is mainly used because it is excellent in transparency at around 193 nm.

In view of a pattern forming method, in addition to a countermeasure for ultraminiaturization in view of a resist material, techniques for exceeding the limitation of resolution of the resist material have been studied and developed.

As one of these miniaturization techniques, for example, there is proposed a thermal flow process in which a resist pattern is formed by a conventional lithography technique and the resist pattern is subjected to a heat treatment thereby conducting miniaturization of the pattern size (see, for example, Patent Documents 2 and 3).

The thermal flow process is a process in which a resist pattern is once formed by a photolithography technique and the resist pattern is softened and allowed to flow in the space direction of the pattern by heating, thus decreasing the pattern size of a resist pattern, namely, the size (pore diameter of a hole pattern, space width of a line and space (L&S) pattern, etc.) of the portions on which no resist pattern is formed.

(Patent Document 1)
Japanese Unexamined Patent Application, First Publication No. 2003-241385
(Patent Document 2)
Japanese Unexamined Patent Application, First Publication No. 2000-188250
(Patent Document 3)
Japanese Unexamined Patent Application, First Publication No. 2000-356850

DISCLOSURE OF THE INVENTION

However, a resist composition used in a conventional ArF excimer laser lithography has a problem that a base resin is not sufficiently softened at a heating temperature in a thermal flow process since the base resin has a high glass transition temperature, and thus it is difficult to form a resist pattern through thermal flow.

Under these circumstances, the present invention has been made and an object thereof is to provide a positive resist composition which is suited for thermal flow having excellent controllability of a resist pattern size in a thermal flow process using a resist composition used in ArF excimer laser lithography, and a method for forming a resist pattern.

MEANS FOR SOLVING THE PROBLEMS

The present inventors propose the following means for achieving the above object.

Namely, a first aspect of the present invention pertains to a positive resist composition comprising a resin component (A) which exhibits increased alkali solubility under the action of an acid, and an acid generator component (B) which generates an acid upon exposure, wherein the resin component (A) contains a polymer compound (A1) containing a structural unit (a0) represented by general formula (a0) shown below:

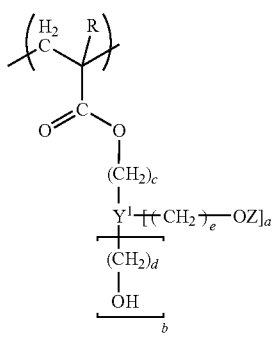

(wherein R represents a hydrogen atom, a halogen atom, a lower alkyl group, or a halogenated lower alkyl group; $Y^1$ represents an aliphatic cyclic group; Z represents an acid dissociable, dissolution inhibiting group containing a tertiary alkyl group; a represents an integer from 1 to 3, b represents an integer from 0 to 2, and a+b 1 to 3; c, d and e each represents, independently, an integer from 0 to 3), and a structural unit (a2) derived from an acrylate ester containing a lactone-containing cyclic group.

Also, a second aspect of the present invention pertains to a positive resist composition for thermal flow, comprising a resin component (A) which exhibits increased alkali solubility under the action of an acid, and an acid generator component (B) which generates an acid upon exposure, wherein the resin component (A) contains a polymer compound (A2) containing a structural unit (a0)' represented by general formula (a0)' shown below:

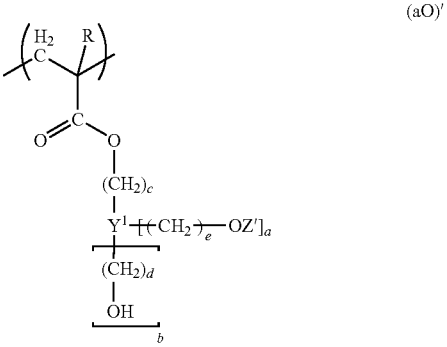

(wherein R represents a hydrogen atom, a halogen atom, a lower alkyl group, or a halogenated lower alkyl group; $Y^1$ represents an aliphatic cyclic group; Z' represents an acid dissociable, dissolution inhibiting group; a represents an integer from 1 to 3, b represents an integer from 0 to 2, and a+b=1 to 3; and c, d and e each represents, independently, an integer from 0 to 3].

Also, a third aspect of the present invention pertains to a method for forming a resist pattern, comprising the steps of forming a resist film on a substrate using the positive resist composition according to the first aspect; exposing the resist film; developing the resist film to form a resist pattern; and conducting a thermal flow treatment.

Also, a fourth aspect of the present invention pertains to a method for forming a resist pattern, comprising the steps of forming a resist film on a substrate using the positive resist composition for thermal flow according to the second aspect; exposing the resist film; developing the resist film to form a resist pattern; and conducting a thermal flow treatment.

In the specification and claims, "structural unit" means a monomer unit constituting a resin component (polymer).

The term "exposure" is used as a general concept which includes the entire irradiation of the radiation.

According to the present invention, it is possible to provide a positive resist composition which is suited for thermal flow having excellent controllability of a resist pattern size in a thermal flow process using a resist composition used in ArF excimer laser lithography, and a method for forming a resist pattern.

BEST MODE FOR CARRYING OUT THE INVENTION

Positive Resist Composition

Figure 1:
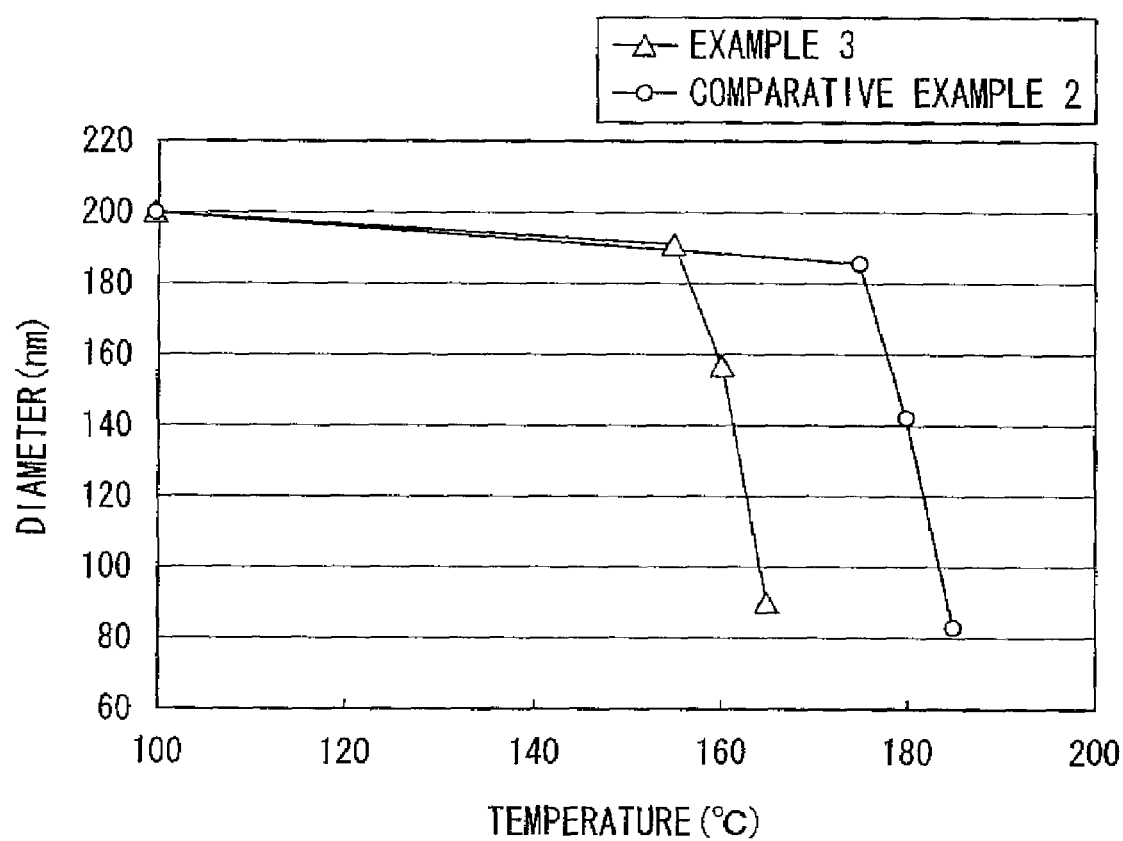
FIG. 1 is a graph showing the results of thermal flow characteristics of Example 3.

The positive resist composition of the present invention contains a resin component (A) which exhibits increased alkali solubility under the action of an acid (hereinafter referred to as component (A)), and an acid generator component (B) which generates an acid upon exposure (hereinafter referred to as component (B)).

Also, the present invention pertains to a positive resist composition which is particularly suited for a thermal flow process.

In the positive resist composition of the present invention, the component (A) is an alkali-insoluble component and, when an acid is generated from the component (B) upon exposure, the acid causes the acid-dissociable, dissolution-inhibiting groups to dissociate, and thus alkali solubility of the entire component (A) increases and the component (A) changes from an alkali-insoluble state to an alkali-soluble state. Therefore, when a resist film made of the positive resist composition is selectively exposed in formation of a resist pattern, the exposed portions are changed to an alkali-soluble state, whereas, the unexposed portions are maintained as an alkali-insoluble state. Thus, a positive resist pattern can be formed by alkali-developing.

Component (A)

In the present invention, the component (A) contains a polymer compound (A1) containing a structural unit (a0) represented by general formula (a0), and a structural unit (a2) derived from an acrylate ester containing a lactone-containing cyclic group.

Preferably, the polymer compound (A1) further contains a structural unit (a1) derived from an acrylate ester containing an acid dissociable, dissolution inhibiting group, which does not correspond to the structural unit (a0).

In the specification and claims, the term "structural unit derived from an acrylate ester" refers to a structural unit formed by cleavage of the ethylenic double bond of an acrylate ester.

The term "acrylate ester" is used as a general concept which includes an acrylate ester in which a substituent (an atom or a group other than a hydrogen atom) is bonded to the α-position carbon atom besides an acrylate ester in which a hydrogen atom is bonded to the α-position carbon atom. Examples of the substituent include a halogen atom, a lower alkyl group, and a halogenated lower alkyl group. Examples of the halogen atom include a fluorine atom, a chlorine atom, a bromine atom, and an iodine atom, of which a fluorine atom is preferred.

Unless stated otherwise, the term "α-position (α-position carbon atom)" of a "structural unit derived from an acrylate ester" refers to the carbon atom to which the carbonyl group is bonded.

The "alkyl group", unless stated otherwise, includes straight chain, branched chain, and cyclic monovalent saturated hydrocarbon groups.

A "lower alkyl group" is an alkyl group of 1 to 5 carbon atoms.

In the acrylate ester, specific examples of the lower alkyl group as the α-position substituent include lower straight chain or branched chain alkyl groups such as a methyl group, an ethyl group, a propyl group, an isopropyl group, an n-butyl group, an isobutyl group, a tert-butyl group, a pentyl group, an isopentyl group, and a neopentyl group.

The term "halogenated lower alkyl group" is a group in which a portion of, or all of, the hydrogen atoms in the lower alkyl group are substituted with a halogen atom. Examples of the halogen atom substituted with the hydrogen atom include a fluorine atom, a chlorine atom, a bromine atom, and an iodine atom, of which a fluorine atom is preferable.

The substituent bonded to the acrylate ester at the α-position is preferably a hydrogen atom, a halogen atom, a lower alkyl group, or a halogenated lower alkyl group, more preferably a hydrogen atom, a fluorine atom, a lower alkyl group, or a fluorinated lower alkyl group, and most preferably a hydrogen atom or a methyl group for reasons such as industrial availability.

Structural Unit (a0)

The polymer compound (A1) contains a structural unit (a0) represented by general formula (a0). Inclusion of the structural unit (a0) decreases the glass transition temperature of the polymer compound (A1) and exerts the effects of the present invention. In the polymer compound (A1), the glass transition temperature is lower, and also the decomposition temperature is the same or higher as compared with the resin containing no structural unit (a0).

In general formula (a0), R is a hydrogen atom, a halogen atom, a lower alkyl group, or a halogenated lower alkyl group. The halogen atom, lower alkyl group or halogenated lower alkyl group are the same as the halogen atom, lower alkyl group or halogenated lower alkyl group which may be bonded to the α-position of the acrylate ester. R is preferably a methyl group.

In general formula (a0), $Y^1$ represents an aliphatic cyclic group.

In the claims and specification, the term "aliphatic" is a relative concept used in relation to the term "aromatic", and defines a group or compound or the like that contains no aromaticity. The term "aliphatic cyclic group" describes a monocyclic group or polycyclic group that contains no aromaticity.

An "aliphatic cyclic group" in the structural unit (a0) may include a substituent, or not. Examples of the substituent include a lower alkyl group of 1 to 5 carbon atoms, a fluorine atom, a fluorinated lower alkyl group of 1 to 5 carbon atoms substituted with a fluorine atom, or an oxygen atom (=O).

Although the "aliphatic cyclic group" having a basic ring structure in which the substituent group has been removed need not necessarily be a group formed solely from carbon and hydrogen (namely, a hydrocarbon group), a hydrocarbon group is preferred. Furthermore, the "hydrocarbon group" may be either saturated or unsaturated, but is preferably saturated. A polycyclic group is preferably.

Specific examples of this type of aliphatic cyclic group include groups in which two or more hydrogen atoms have been removed from a monocycloalkane or a polycycloalkane such as a bicycloalkane, tricycloalkane or tetracycloalkane, which may, or may not, be substituted with a lower alkyl group, a fluorine atom, or a fluorinated lower alkyl group. Specific examples of suitable groups include groups in which two or more hydrogen atoms have been removed from a monocycloalkane such as cyclopentane or cyclohexane, or a polycycloalkane such as adamantane, norbornane, isobornane, tricyclodecane or tetracyclododecane, of which a group in which two or more hydrogen atoms have been removed from adamantane is preferred.

In general formula (a0), Z represents an acid dissociable, dissolution inhibiting group containing a tertiary alkyl group.

Herein, the term "tertiary alkyl group" represents an alkyl group containing a tertiary carbon atom. As described above, the term "alkyl group" represents a monovalent saturated hydrocarbon group and includes a chain (straight chain, branched chain) alkyl group and an alkyl group having a cyclic structure.

In the positive resist composition of the present invention, Z is dissociated by exposure to form a hydrogen atom in the exposed portions, and thus the hydrophilicity of the polymer component (A1) is enhanced, thereby improving the affinity with the developing solution, improving the alkali solubility of the exposed portions, and contributing to an improvement in the resolution.

It is possible to use, as Z, those proposed as an acid dissociable, dissolution inhibiting group of the base resin for a chemically amplified photoresist, and examples thereof include an acid dissociable, dissolution inhibiting group which does not have a cyclic structure and contains a chain-like tertiary alkyl group, and an acid dissociable, dissolution inhibiting group containing a tertiary alkyl group having a cyclic structure.

In the acid dissociable, dissolution inhibiting group which does not contain a cyclic structure and contains a chain-like tertiary alkyl group, the chain-like tertiary alkyl group is preferably a branched chain alkyl group and is preferably a group of 4 to 7 carbon atoms, more preferably 4 to 6 carbon atoms, and most preferably 4 to 5 carbon atoms. Specifically, a tert-butyl group and a tert-amyl group are preferable, and a tert-butyl group is more preferable.

Examples of the acid dissociable, dissolution inhibiting group which does not have a cyclic structure and contains a chain-like tertiary alkyl group include a tertiary alkyloxycarbonyl group such as a tert-butyloxycarbonyl group (t-boc) or a tert-amyloxycarbonyl group; a tertiary alkyloxycarbonylalkyl group such as a tert-butyloxycarbonylmethyl group or a tert-butyloxycarbonylethyl group; and a branched chain tertiary alkyl group such as a tert-butyl group or a tert-amyl group, of which a tertiary alkyloxycarbonyl group and a tertiary alkyloxycarbonylalkyl group are preferable, and a tertiary alkyloxycarbonyl group is more preferable. Of these groups, a tert-butyloxycarbonyl group (t-boc) is most preferable.

In the acid dissociable, dissolution inhibiting group containing a tertiary alkyl group having a cyclic structure, the number of carbon atoms constituting the ring of the cyclic structure is preferably from 4 to 12, more preferably from 5 to 10, and most preferably from 6 to 10.

Examples of the cyclic group include groups in which one or more hydrogen atoms have been removed from a monocycloalkane or a polycycloalkane such as a bicycloalkane, tricycloalkane or tetracycloalkane. Examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Examples of the acid dissociable, dissolution inhibiting group containing a tertiary alkyl group having a cyclic structure include an acid dissociable, dissolution inhibiting group in which a chain-like alkyl group or branched chain alkylene group is bonded to carbon atoms of a cycloalkyl group (on the ring).

The cycloalkyl group in the acid dissociable, dissolution inhibiting group in which a branched chain alkylene group is bonded may include a substituent. Examples of the substituent include a fluorine atom, a fluorinated lower alkyl group of 1 to 5 carbon atoms substituted with a fluorine atom, and an oxygen atom (=O).

In the acid dissociable, dissolution inhibiting group containing a tertiary alkyl group having a cyclic structure to which a chain-like alkyl group is bonded, the carbon atom on the ring to which a chain-like alkyl group is bonded is a tertiary carbon atom. The number of carbon atoms of the chain-like alkyl group is preferably from 1 to 5, more preferably from 1 to 4, and most preferably from 1 to 3. Specific examples thereof include a 2-methyl-2-adamantyl group, a 2-ethyl-2-adamantyl group, a 1-methyl-1-cycloalkyl group, and a 1-ethyl-1-cycloalkyl group.

In the acid dissociable, dissolution inhibiting group containing a tertiary alkyl group having a cyclic structure to which a chain-like alkyl group is bonded, the carbon atom of the alkylene group is a tertiary carbon atom. Specifically, a group represented by general formula (a0-0-1) shown below is preferable.

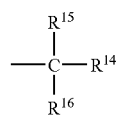

(a0-0-1)

In general formula (a0-0-1), $R^{15}$ and $R^{16}$ each independently represents a straight chain or branched chain alkyl group, and is preferably a group of 1 to 5 carbon atoms.

$R^{14}$ is a cycloalkyl group. Also, $R^{14}$ may include a substituent. Examples of the substituent include, a fluorine atom, a fluorinated lower alkyl group of 1 to 5 carbon atoms substituted with a fluorine atom, and an oxygen atom (=O).

Of these acid dissociable, dissolution inhibiting groups (Z), a tert-butyloxycarbonyl group (t-boc) is most preferable.

In general formula (a0), a represents an integer from 1 to 3, and preferably 1.

b represents an integer from 0 to 2, and preferably 0.

a+b=1 to 3, and preferably 1.

c represents an integer from 0 to 3, preferably 0 or 1, and more preferably 0. d represents an integer from 0 to 3, preferably 0 or 1, and more preferably 0. e represents an integer from 0 to 3, preferably 0 or 1, and more preferably 0.

As the structural unit (a0), a structural unit represented by general formula (a0-1) shown below is particularly preferred:

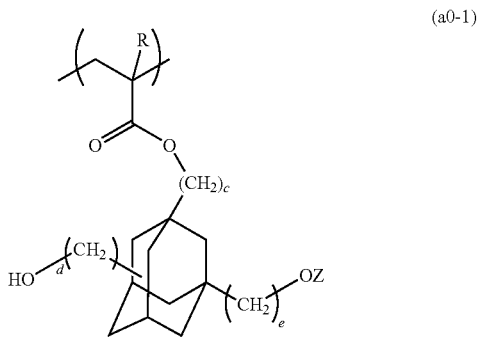

(a0-1)

(wherein R represents a hydrogen atom, a halogen atom, a lower alkyl group, or a halogenated lower alkyl group; Z represents an acid dissociable, dissolution inhibiting group containing a tertiary alkyl group; and c, d and e each represents, independently, an integer from 0 to 3).

The monomer from which the structural unit (a0) is derived can be synthesized, for example, by protecting a hydroxyl group of a (meth)acrylate compound containing 1 to 3 alcoholic hydroxyl groups with a protective group containing a tertiary alkyl group using a known technique.

The term "(meth)acrylate" means either one of, or both, an acrylate in which a hydrogen atom is bonded to the α-position, and a methacrylate in which a methyl group is bonded to the α-position.

In the polymer compound (A1), structural units (a0) may be used alone, or two or more kinds of them may be used in combination.

The proportion of the structural unit (a0) in the polymer compound (A1), relative to the entire structural units constituting the polymer compound (A1), is preferably within a range from 10 to 60 mol %, more preferably from 10 to 40 mol %, and most preferably from 15 to 30 mol %. Ensuring that this proportion is at least as large as the lower limits of the above ranges enables the effects obtained by including the structural unit (a0) to be satisfactorily realized, whereas ensuring that the proportion is no greater than the upper limits enables a more favorable balance to be achieved with the other structural units.

Structural Unit (a2)

The polymer compound (A1) contains a structural unit (a2) derived from an acrylate ester containing a lactone-containing cyclic group. Inclusion of the structural unit (a2) enhances lithography characteristics such as resolution, and contributes to control of the glass transition temperature of the polymer compound (A1).

Here, the term "lactone-containing cyclic group" refers to a cyclic group containing a single ring (lactone ring) containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

When the polymer compound (A1) is used to form a resist film, the use of the lactone-containing cyclic group of the structural unit (a2) is effective in improving the adhesion between the resist film and the substrate, and improving affinity between the resist film and the developing solution.

There are no particular restrictions on the structural unit (a2), and any unit can be used.

Specific examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane or tetracycloalkane.

More specific examples of the structural unit (a2) include the structural units represented by general formulas (a2-1) to (a2-5) shown below:

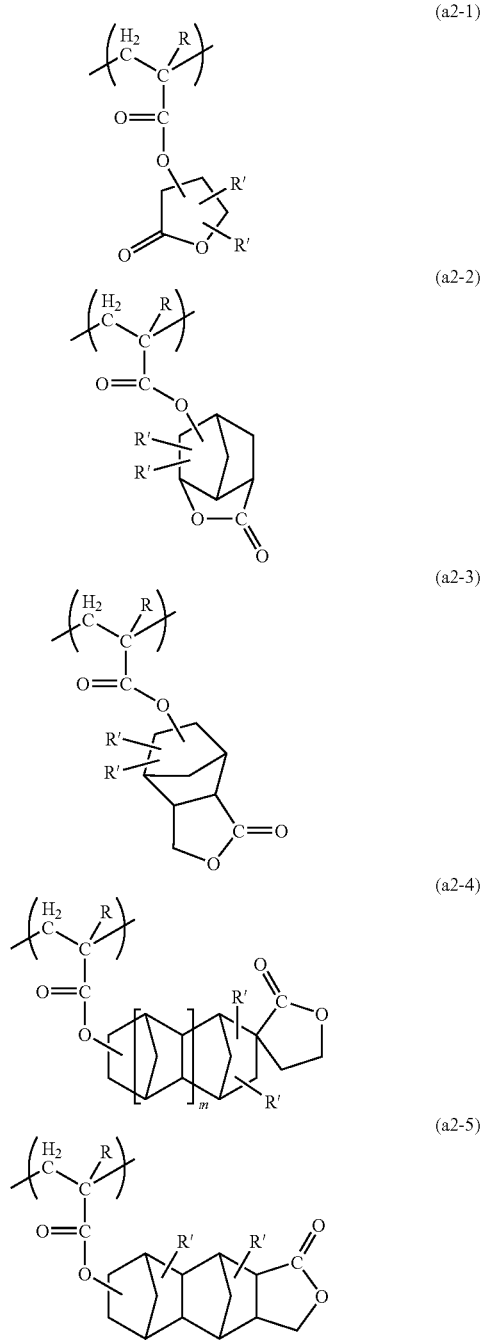

(wherein R represents a hydrogen atom, a halogen atom, a lower alkyl group, or a halogenated lower alkyl group; R' represents a hydrogen atom, a lower alkyl group, or an alkoxy group of 1 to 5 carbon atoms; and m represents an integer of either 0 or 1).

R in general formulas (a2-1) to (a2-5) is the same as the hydrogen atom, halogen atom, lower alkyl group or halogenated lower alkyl group which may be bonded to the α-position of the acrylate ester.

The lower alkyl group of R' is the same as the lower alkyl group of R. Namely, it is the same as the lower alkyl group which may be bonded to the α-position of the acrylate ester.

In general formulas (a2-1) to (a2-5), from the viewpoint of factors such as industrial availability, R' is preferably a hydrogen atom.

Specific structural units of general formulas (a2-1) to (a2-5) are shown below.

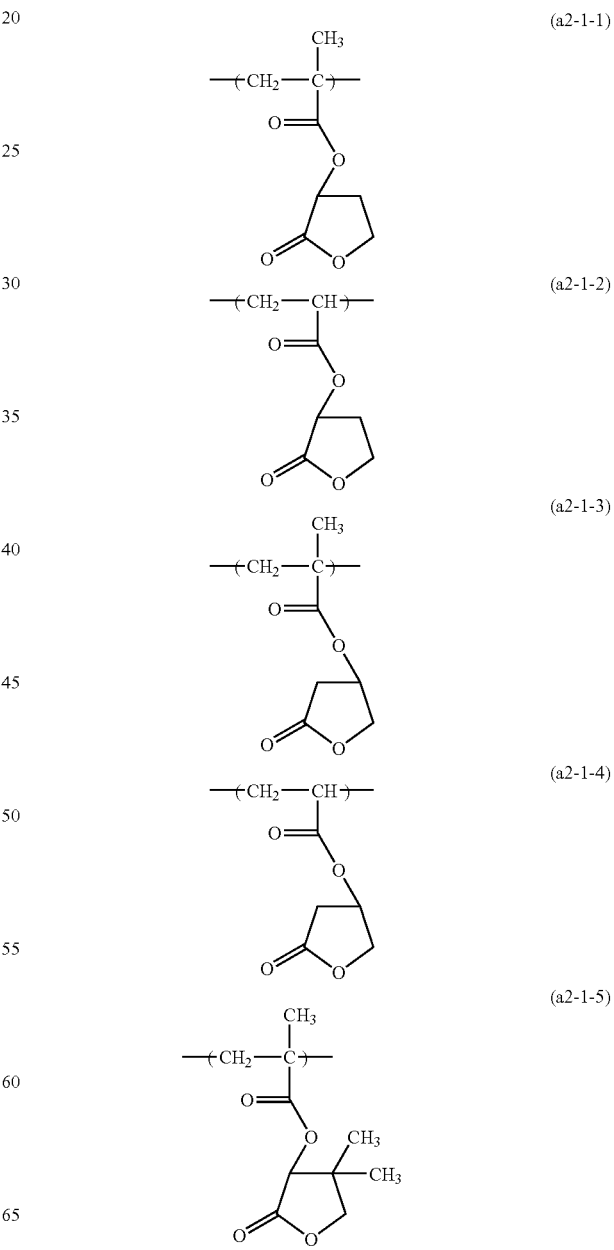

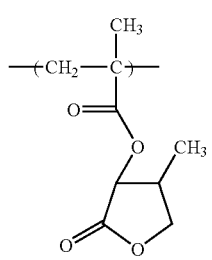
(a2-1-6)
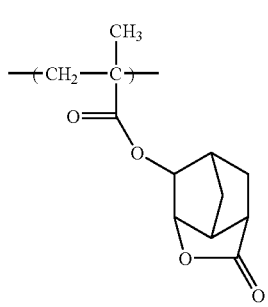
(a2-2-1)
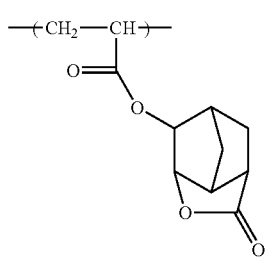
(a2-2-2)
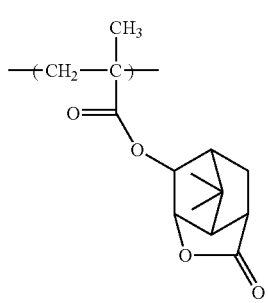
(a2-2-3)
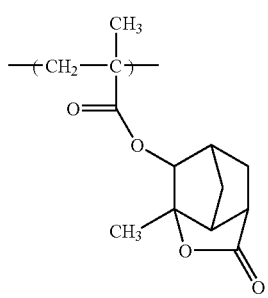
(a2-2-4)
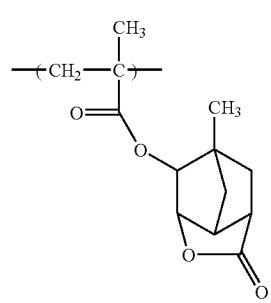
(a2-2-5)
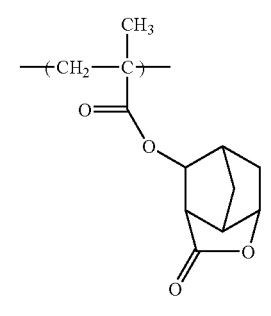
(a2-2-6)
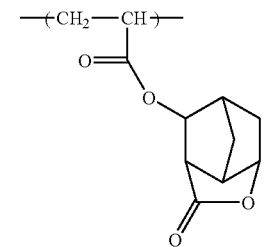
(a2-2-7)
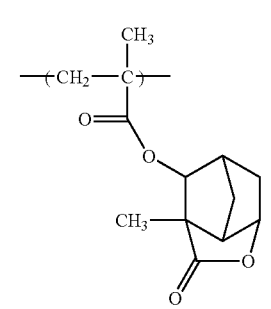
(a2-2-8)
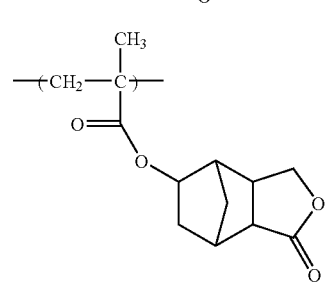
(a2-3-1)
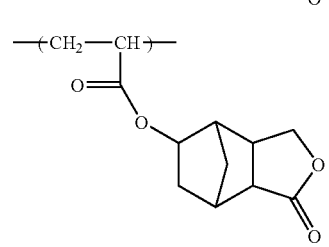
(a2-3-2)

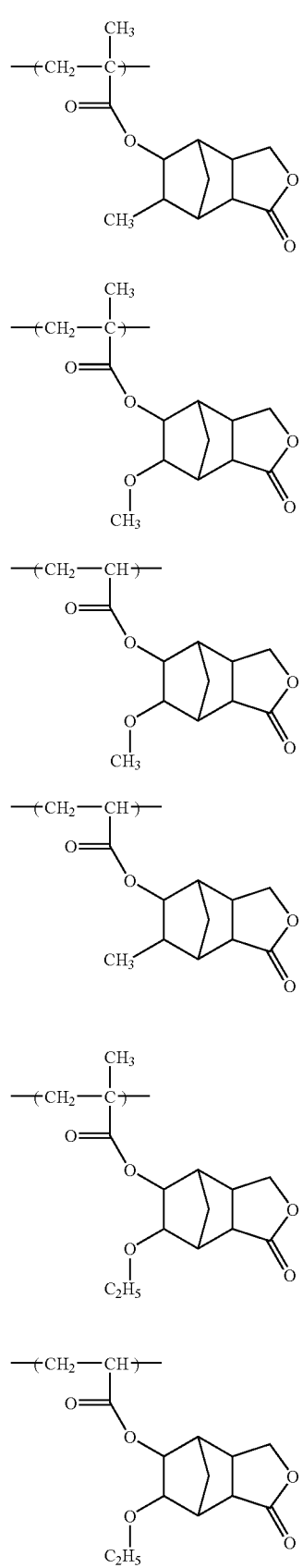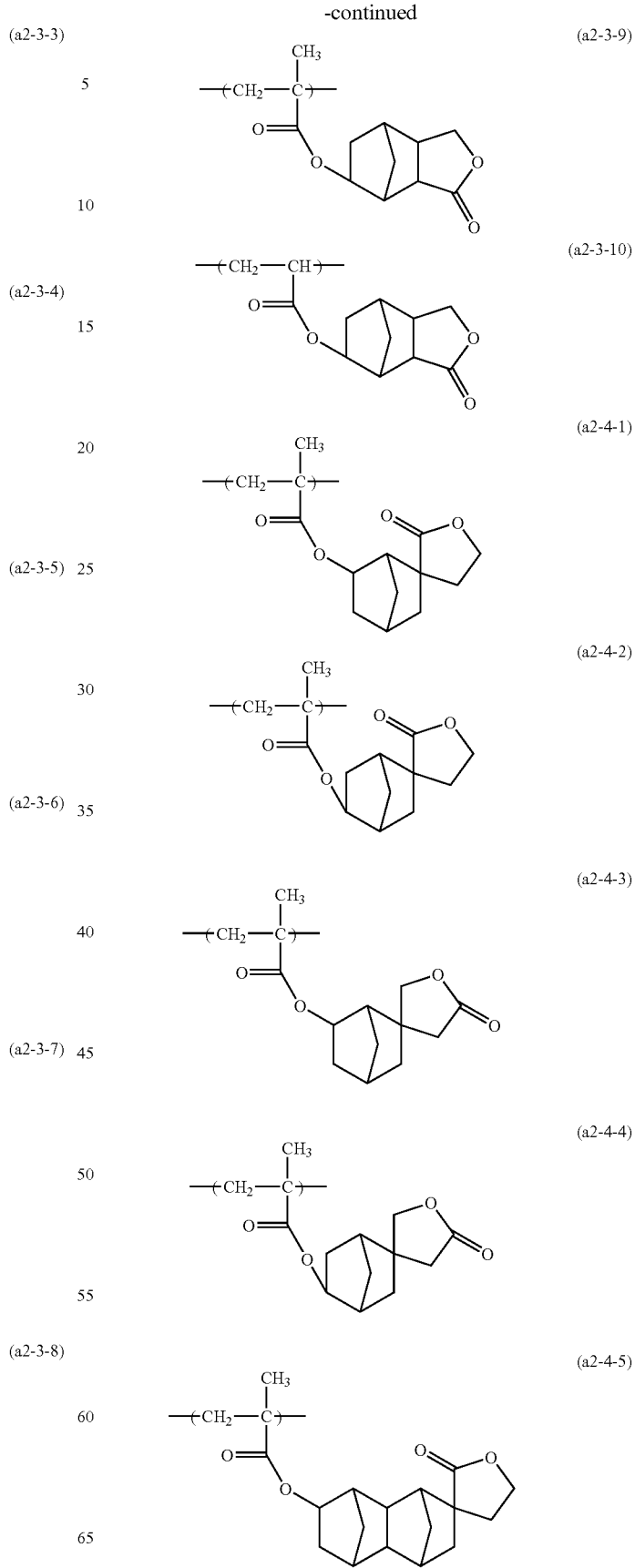

-continued

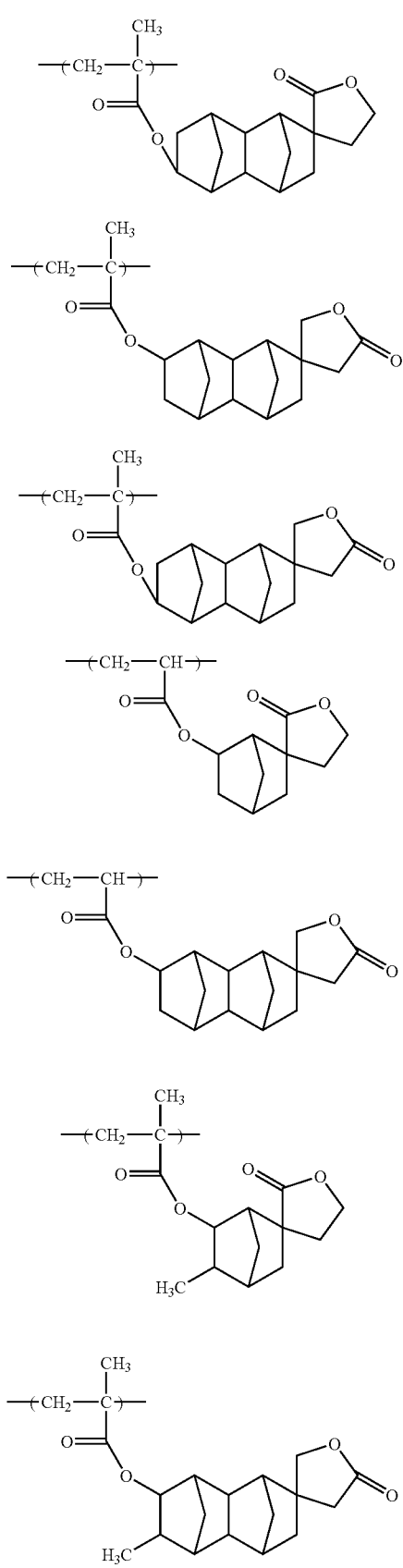

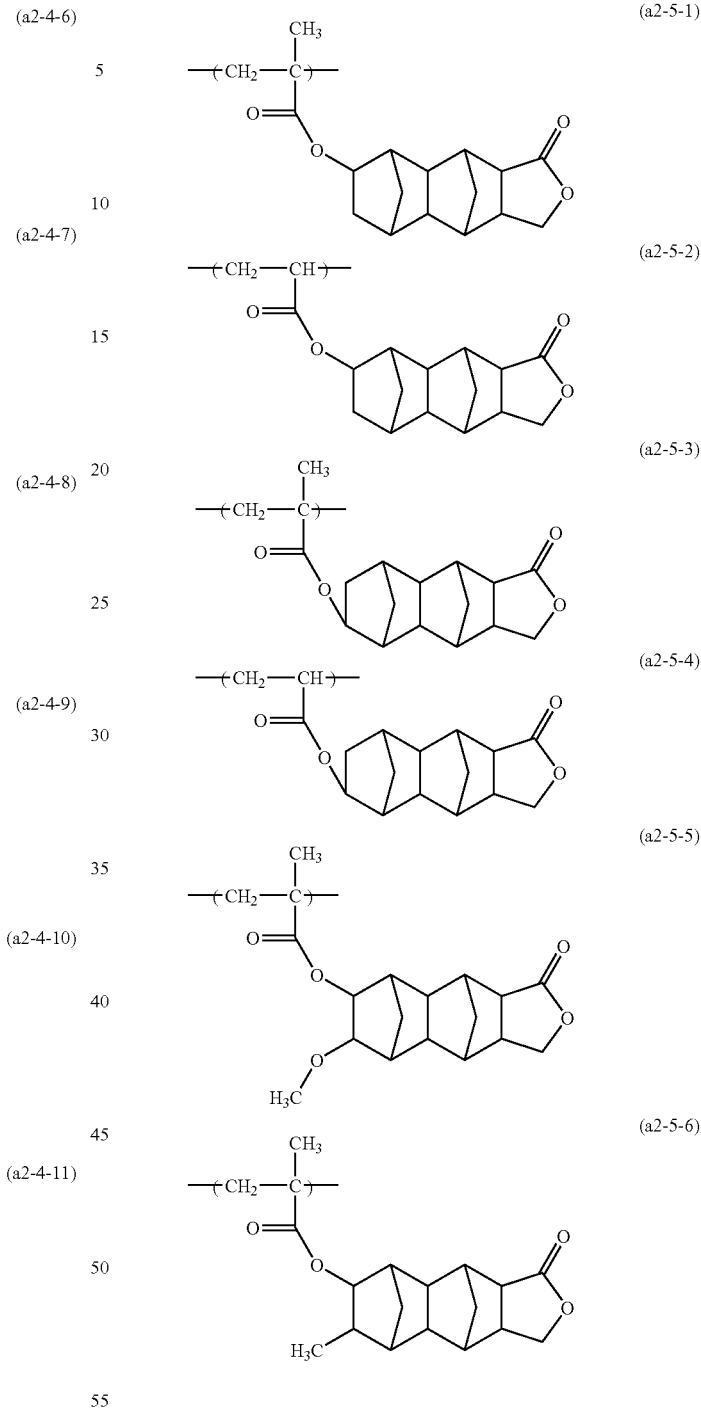

As the structural unit (a2), at least one structural unit selected from structural units of general formulas (a2-1) to (a2-5) is preferred and the use of at least one structural unit selected from structural units of general formulas (a2-1) and (a2-3) is preferred. Specifically, the use of at least one structural unit selected from structural units of chemical formulas (a2-1-1), (a2-1-2), (a2-2-1), (a2-2-2), (a2-3-1), (a2-3-2), (a2-3-9) and (a2-3-10) is preferred.

From the viewpoint of controllability of the glass transition temperature, a structural unit containing a monocyclic group is preferred and a structural unit represented by general formula (a2-1) is particularly preferred. Specifically, structural units represented by chemical formulas (a2-1-1) and (a2-1-2) are preferred and a structural unit represented by chemical formula (a2-1-1) is most preferred.

In the polymer compound (A1), structural units (a2) may be used alone, or two or more kinds of them may be used in combination.

The proportion of the structural unit (a2) in the polymer compound (A1), relative to the total of the entire structural units constituting the polymer compound (A1) is preferably within a range from 5 to 70 mol %, more preferably from 20 to 60 mol %, and most preferably from 30 to 60 mol %. Ensuring that this proportion is at least as large as the lower limits of the above ranges enables the effects obtained by including the structural unit (a2) to be satisfactorily realized, whereas ensuring that the proportion is no greater than the upper limits enables a balance to be achieved with the other structural units.

Structural Unit (a1)

The polymer compound (A1) preferably further contains a structural unit (a1) derived from an acrylate ester containing an acid dissociable, dissolution inhibiting group, which does not correspond to the structural unit (a0). Inclusion of the structural unit (a1) improves alkali solubility of the entire polymer compound (A1).

As the structural unit (a1), a structural unit having the effect of improving alkali solubility of the entire polymer compound (A1) is preferred as compared with the structural unit (a0) containing an aliphatic cyclic group ($Y^1$) after dissociation of the acid dissociable, dissolution inhibiting group (Z).

The acid dissociable, dissolution inhibiting group in the structural unit (a1) can use any of the groups which have been proposed as acid-dissociable, dissolution-inhibiting groups for the base resins of chemically amplified resists, provided the group has an alkali dissolution-inhibiting effect that renders the entire polymer compound (A1) alkali-insoluble in prior to dissociation, and then following dissociation, causes the entire polymer compound (A1) to change to an alkali-soluble state. Generally, groups which form either a cyclic or chain-like tertiary alkyl ester, or form a cyclic or a chain-like alkoxyalkyl ester group with the carboxyl group of (meth) acrylic acid are the most widely known. The term "(meth) acrylate ester" includes either one of, or both, an acrylate ester with a hydrogen atom bonded at the α-position and a methacrylate ester with a methyl group bonded at the α-position.

Herein, a "tertiary alkyl ester" describes a structure in which an ester is formed by substituting the hydrogen atom of the carboxyl group with an alkyl group or a cycloalkyl group, and the tertiary carbon atom of the alkyl group or the cycloalkyl group is bonded to the oxygen atom at the terminal of the carbonyloxy group (—C(O)—O—) of the ester. In this tertiary alkyl ester, the action of the acid causes cleavage of the bond between the oxygen atom and the tertiary carbon atom.

The alkyl group or the cycloalkyl group may include a substituent.

The group that forms the tertiary alkyl ester with the carboxyl group, thereby exhibiting acid dissociability, is referred to as a "tertiary alkyl ester type acid dissociable, dissolution inhibiting group" for convenience sake.

A "cyclic or chain-like alkoxyalkyl ester" describes a structure in which an ester is formed by substituting the hydrogen atom of the carboxyl group with an alkoxyalkyl group, and the alkoxyalkyl group is bonded to the oxygen atom at the terminal of the carbonyloxy group (—C(O)—O—) of the ester. In this alkoxyalkyl ester, the action of the acid causes cleavage of the bond between the oxygen atom and the alkoxyalkyl group.

The structural unit (a1) is preferably at least one unit selected from the group consisting of structural units represented by general formulas (a1-0-1) and (a1-0-2) shown below:

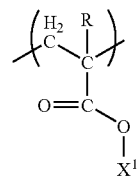

(a1-0-1)

(wherein R represents a hydrogen atom, a halogen atom, a lower alkyl group, or a halogenated lower alkyl group; and $X^1$ represents an acid dissociable, dissolution inhibiting group),
and

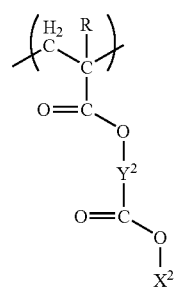

(a1-0-2)

(wherein R represents a hydrogen atom, a halogen atom, a lower alkyl group, or a halogenated lower alkyl group; $X^2$ represents an acid dissociable, dissolution inhibiting group; and $Y^2$ represents an alkylene group or aliphatic cyclic group).

In general formula (a1-0-1), the halogen atom, the lower alkyl group, or the halogenated lower alkyl group represented by R is the same as the halogen atom, lower alkyl group or halogenated lower alkyl group which may be bonded to the acrylate ester at the α-position.

There are no particular restrictions on $X^1$, provided that it is an acid dissociable, dissolution inhibiting group, and includes, for example, alkoxyalkyl group type and tertiary alkyl ester type acid dissociable, dissolution inhibiting groups, although a tertiary alkyl ester type acid dissociable, dissolution inhibiting group is preferable. Examples of the tertiary alkyl ester type acid dissociable, dissolution inhibiting group include an aliphatic branched chain acid dissociable, dissolution inhibiting group and an acid dissociable, dissolution inhibiting group containing an aliphatic cyclic group.

Herein, the term "aliphatic cyclic group" is as defined in the structural unit (a0), and is preferably a polycyclic group.

Specific examples of this type of aliphatic cyclic group include groups in which one or more hydrogen atoms have been removed from a monocycloalkane or a polycycloalkane such as a bicycloalkane, tricycloalkane or tetracycloalkane, which may be substituted with a lower alkyl group, a fluorine atom, or a fluorinated lower alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. The lower alkyl group or fluorinated lower alkyl group as the substituent is the same as the substituent which may be contained in the aliphatic cyclic group in the structural unit (a0), and examples thereof include a lower alkyl group of 1 to 5 carbon atoms, and a fluorinated lower alkyl group of 1 to 5 carbon atoms substituted with a fluorine atom.

Specific examples of the aliphatic branched chain acid dissociable, dissolution inhibiting group include a tert-butyl group and a tert-amyl group.

The acid dissociable, dissolution inhibiting group containing an aliphatic cyclic group includes, for example, a group containing a tertiary carbon atom on a ring skeleton of a cycloalkyl group, and specific examples include a 2-methyl-2-adamantyl group and a 2-ethyl-2-adamantyl group. Alternately, like the structural unit represented by general formula (a1-0-3) shown below, examples include a group containing an aliphatic cyclic group such as an adamantyl group, and a branched chain alkylene group containing a tertiary carbon atom bonded thereto.

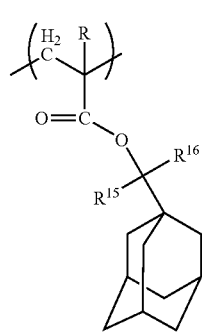

(a1-0-3)

(wherein R is the same as R in general formula (a0), and $R^{15}$ and $R^{16}$ represent are the same as $R^{15}$ and $R^{16}$ in general formula (a0-0-1)).

The alkoxyalkyl group is preferably a group represented by general formula (a1-0-4) shown below.

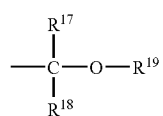

(a1-0-4)

(wherein $R^{17}$ and $R^{18}$ each represents, independently, a straight chain or branched chain alkyl group, or a hydrogen atom; and $R^{19}$ represents a straight chain, branched chain or cyclic alkyl group; or the terminal of $R^{17}$ may be bonded to the terminal of $R^{19}$, thereby forming a ring).

In $R^{17}$ and $R^{18}$, the straight chain or branched chain alkyl group is preferably a group of 1 to 15 carbon atoms and may be either straight chain or branched chain, although an ethyl group and a methyl group are preferable, and a methyl group is most preferable. It is particularly preferred that one of $R^{17}$ and $R^{18}$ is a hydrogen atom and the other one is a methyl group.

$R^{19}$ is a straight chain or branched chain alkyl group or cycloalkyl group and is preferably a group of 1 to 15 carbon atoms, and may be a straight chain, branched chain, or cyclic group.

When $R^{19}$ is a straight chain or branched chain group, it is preferably a group of 1 to 5 carbon atoms, although an ethyl group and a methyl group are more preferable, and an ethyl group is most preferable.

When $R^{19}$ is a cyclic group, it is preferably a group of 4 to 15 carbon atoms, more preferably 4 to 12 carbon atoms, and moat preferably 5 to 10 carbon atoms. Specific examples of this type of cyclic group include groups in which one or more hydrogen atoms have been removed from a monocycloalkane or a polycycloalkane such as a bicycloalkane, tricycloalkane or tetracycloalkane, which may be substituted with a fluorine atom or a fluorinated lower alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Of these groups, a group in which one or more hydrogen atoms have been removed from adamantane is preferable. The fluorinated lower alkyl group as the substituent is the same as the substituent which may be contained in the aliphatic cyclic group in the structural unit (a0) and includes, for example, a fluorinated lower alkyl group of 1 to 5 carbon atoms.

In formula shown above, $R^{19}$ and $R^{19}$ each represents, independently, an alkylene group of 1 to 5 carbon atoms and the terminal of $R^{19}$ may be bonded to the terminal of $R^{17}$.

In this case, a cyclic group is formed by $R^{17}$, $R^{19}$, the oxygen atom to which $R^{19}$ is bonded, and the carbon atom to which the oxygen atom and $R^{17}$ are bonded. The cyclic ring is preferably a 4- to 7-membered ring, and more preferably a 4- to 6-membered ring. Specific examples of the cyclic group include a tetrahydropyranyl group and a tetrahydrofuranyl group.

In general formula (a1-0-2), R is the same as R in formula (a1-0-1). $X^2$ is the same as $X^1$ in formula (a1-0-1) $Y^2$ is preferably an alkylene group of 1 to 4 carbon atoms or a divalent aliphatic cyclic group.

When $Y^2$ is a divalent aliphatic cyclic group, except for the case of using a group in which two or more hydrogen atoms have been removed, the same groups as those exemplified above in relation to the "aliphatic cyclic group" in the structural unit (a1) can be used.

More specifically, the structural unit (a1) includes structural units represented by general formulas (a1-1) to (a1-4):

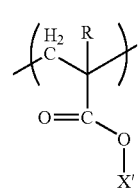

(a1-1)

-continued

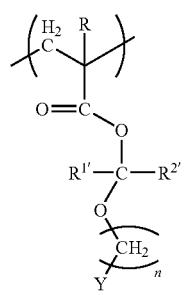
(a1-2)

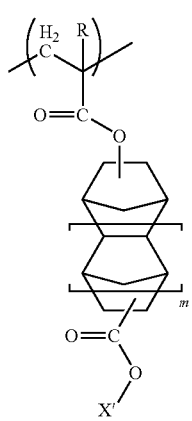
(a1-3)

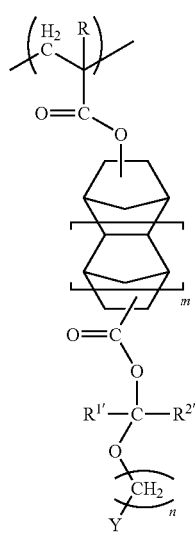
(a1-4)

(wherein X' represents a tertiary alkyl ester type acid dissociable, dissolution inhibiting group; Y represents a lower alkyl group of 1 to 5 carbon atoms, or an aliphatic cyclic group; n represents an integer from 0 to 3; m represents 0 or 1; R represents a hydrogen atom, a halogen atom, a lower alkyl group, or a halogenated lower alkyl group; and $R^{1\prime}$ and $R^{2\prime}$ each represents, independently, a hydrogen atom or a lower alkyl group of 1 to 5 carbon atoms).

The halogen atom, lower alkyl group or halogenated lower alkyl group represented by R in general formulas (a1-1) to (a1-4) is the same as the halogen atom, lower alkyl group or halogenated lower alkyl group which may be bonded to the α-position of the acrylate ester.

At least one of $R^{1\prime}$ and $R^{2\prime}$ is preferably a hydrogen atom, and more preferably both are hydrogen atoms. n is preferably either 0 or 1.

Examples of X' include the same tertiary alkyl ester type acid dissociable, dissolution inhibiting groups as those exemplified above in relation to the group $X^1$.

Examples of the aliphatic cyclic group represented by Y include the same groups as those exemplified in the description of the "aliphatic cyclic group" shown above.

Specific examples of the structural units represented by general formulas (a1-1) to (a1-4) are shown below.

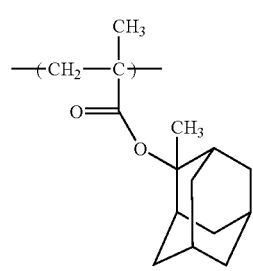
(a1-1-1)

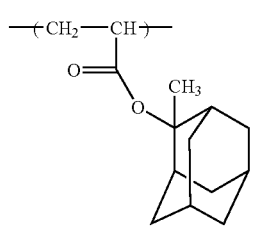
(a1-1-2)

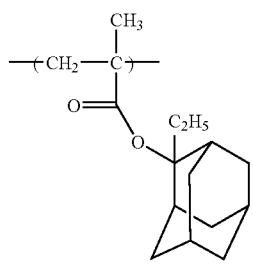
(a1-1-3)

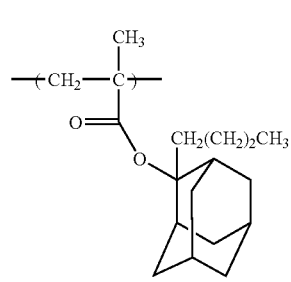
(a1-1-4)

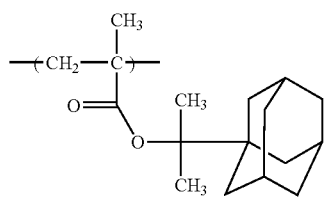
(a1-1-5)

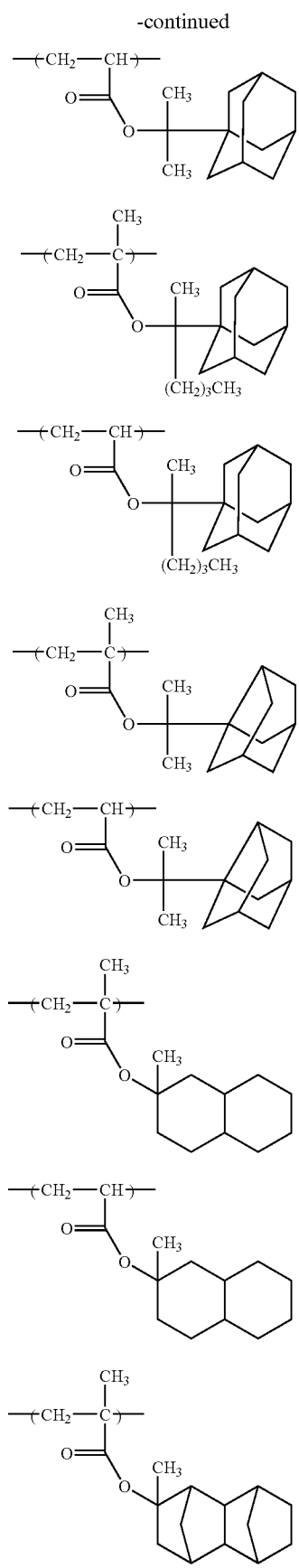
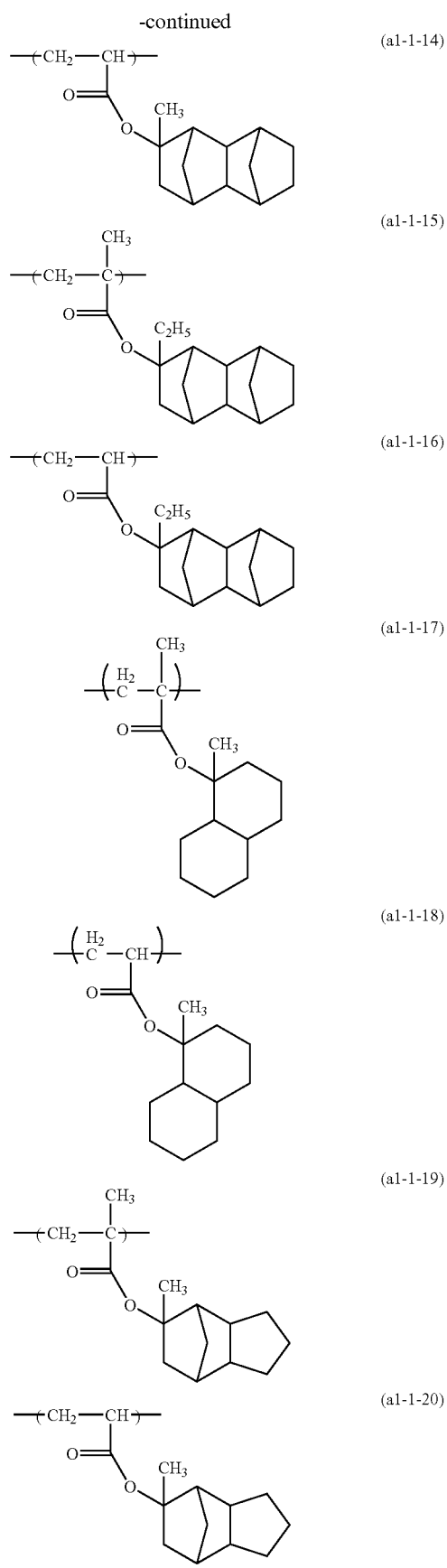

-continued
(a1-1-21)
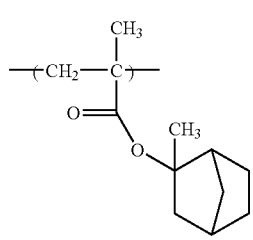
(a1-1-22)
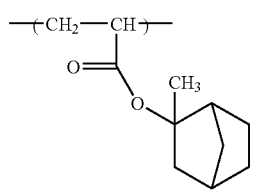
(a1-1-23)
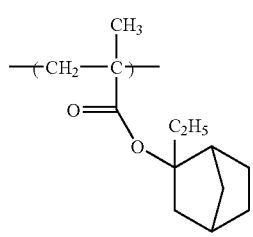
(a1-1-24)
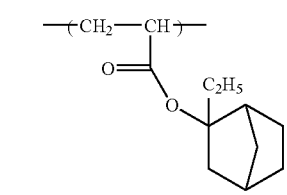
(a1-1-25)
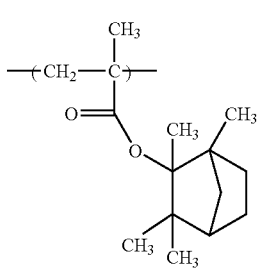
(a1-1-26)
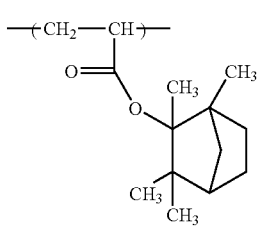
(a1-1-27)
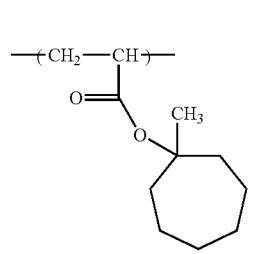
-continued
(a1-1-28)
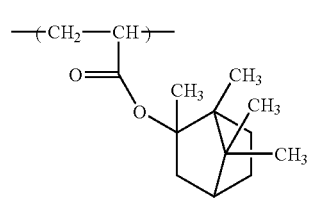
(a1-1-29)
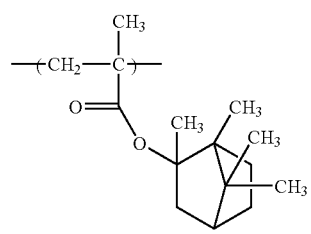
(a1-1-30)
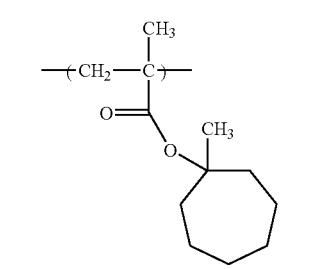
(a1-1-31)
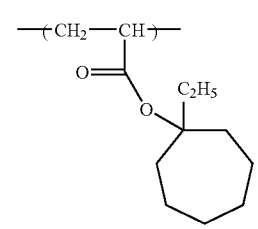
(a1-1-32)
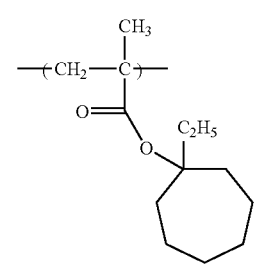
(a1-1-33)
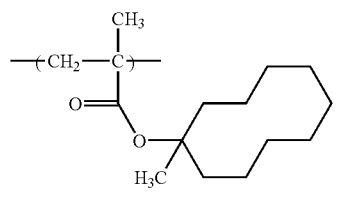
(a1-1-34)
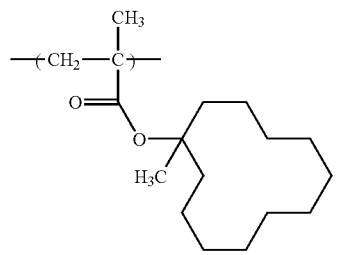

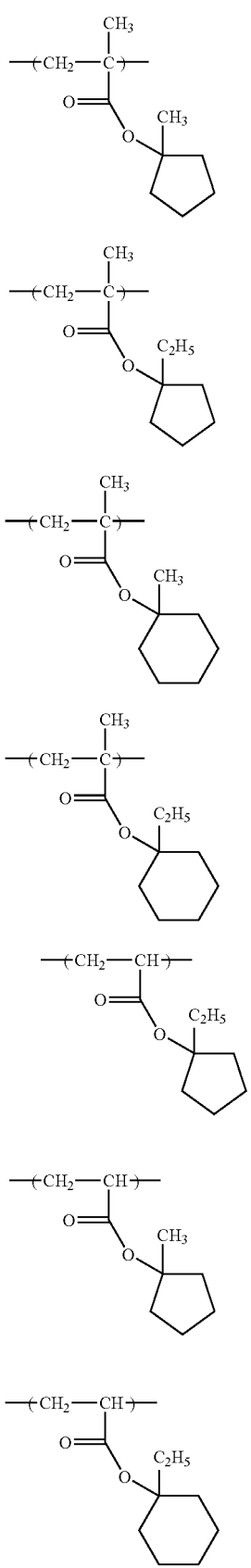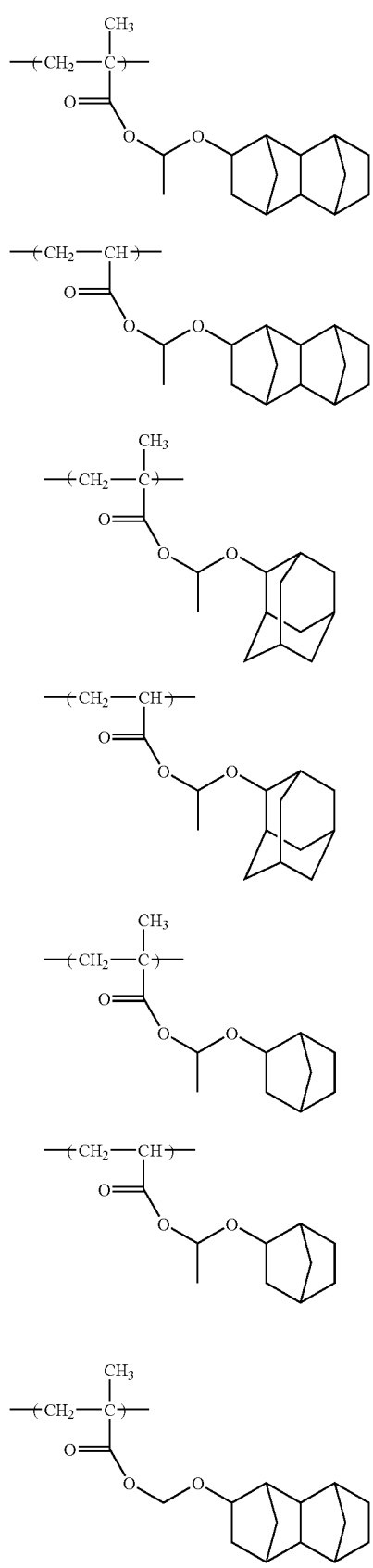

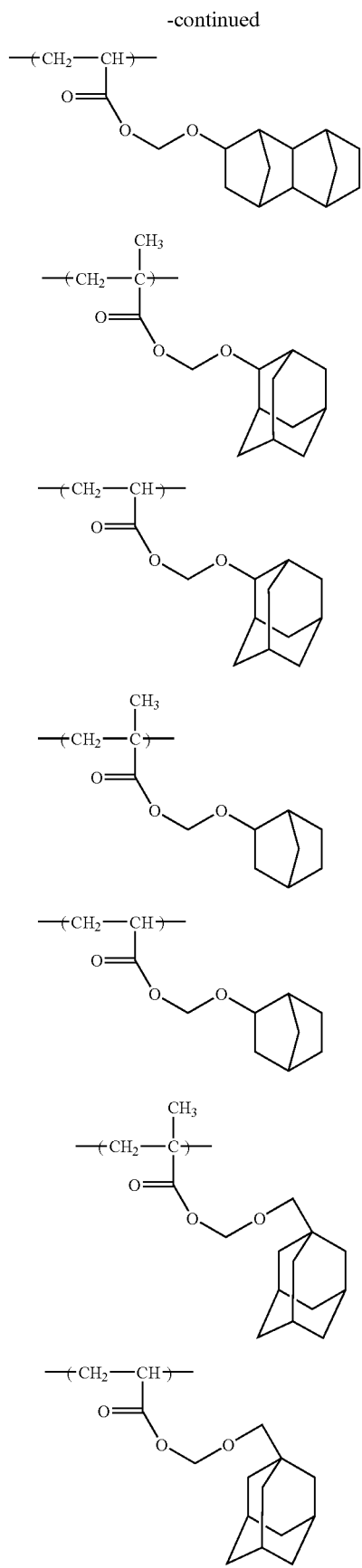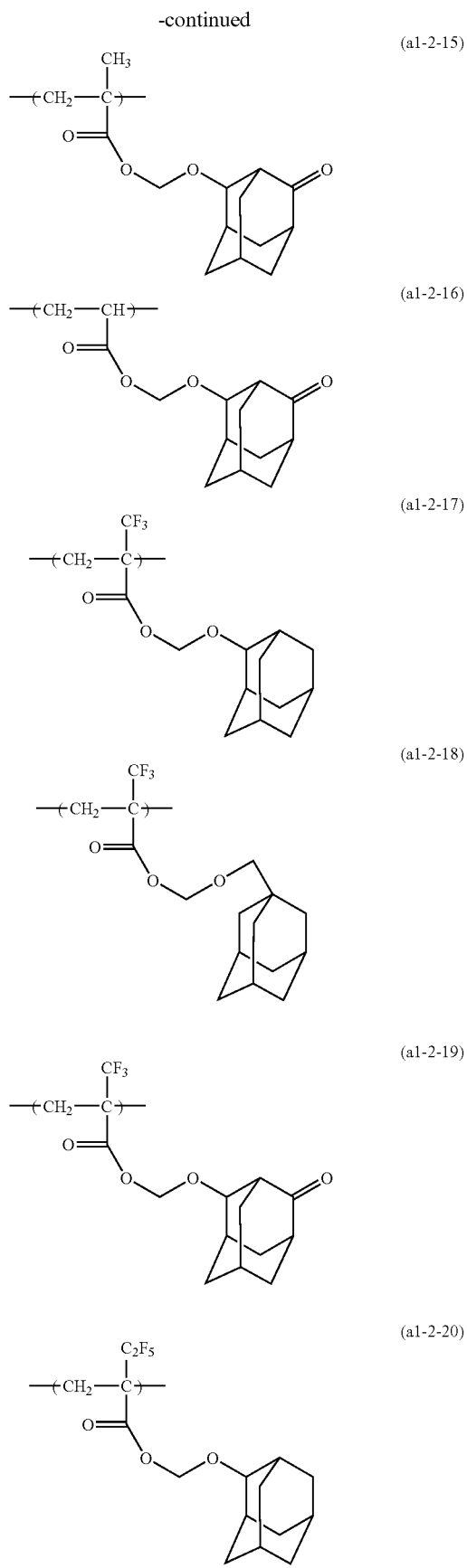

-continued
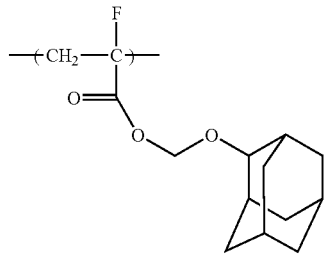
(a1-2-21)
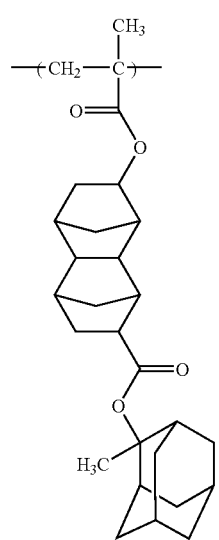
(a1-3-1)
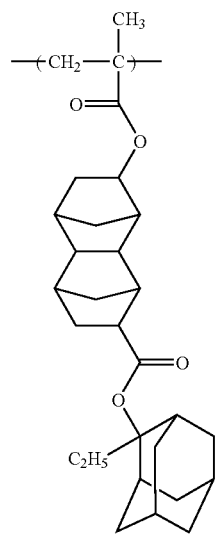
(a1-3-2)
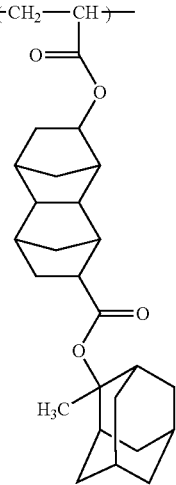
(a1-3-3)
(a1-3-4)
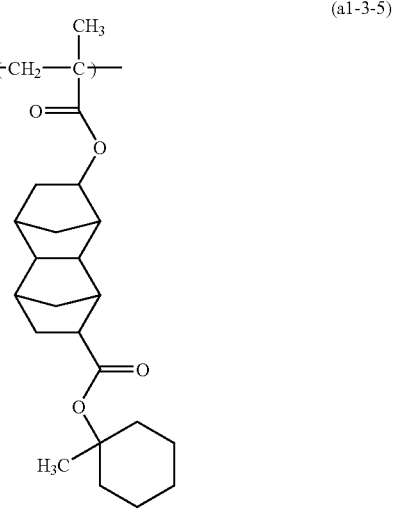
(a1-3-5)

-continued
(a1-3-6)
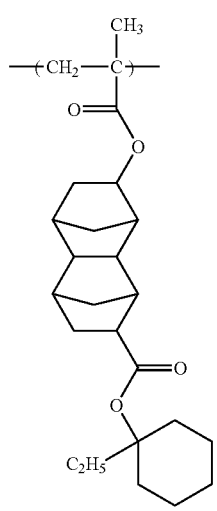
(a1-3-7)
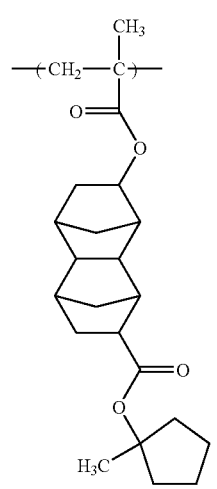
(a1-3-8)
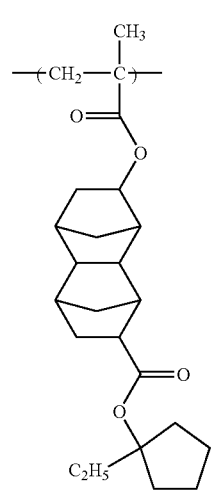
-continued
(a1-3-9)
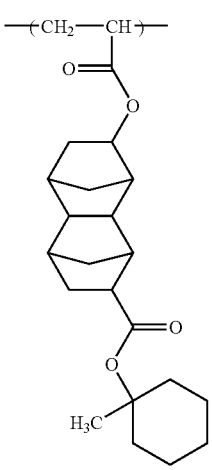
(a1-3-10)
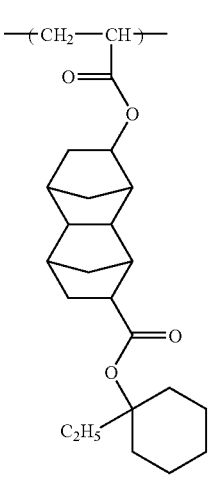
(a1-3-11)
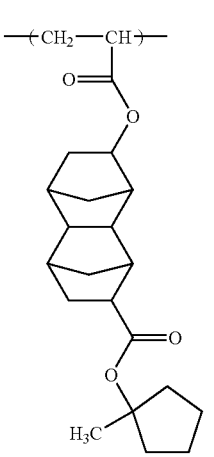

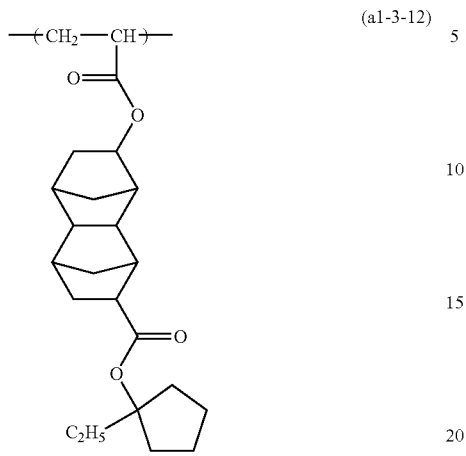
(a1-3-12)
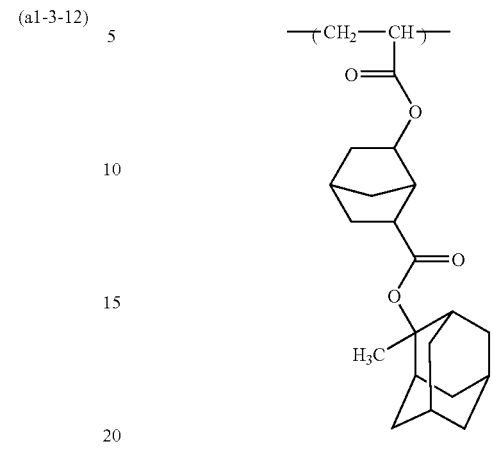
(a1-3-15)
(a1-3-13)
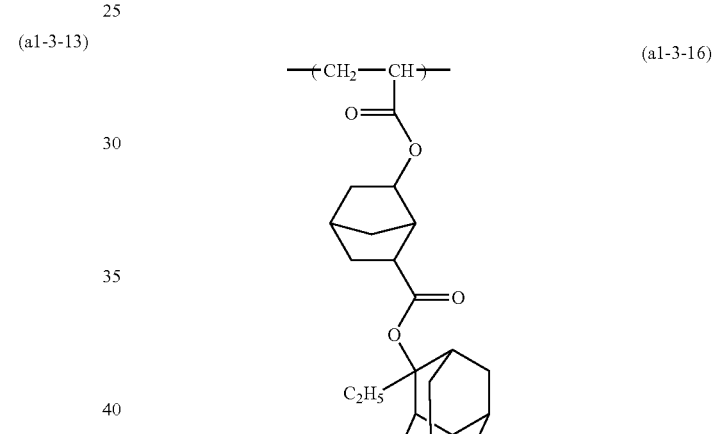
(a1-3-16)
(a1-3-14)
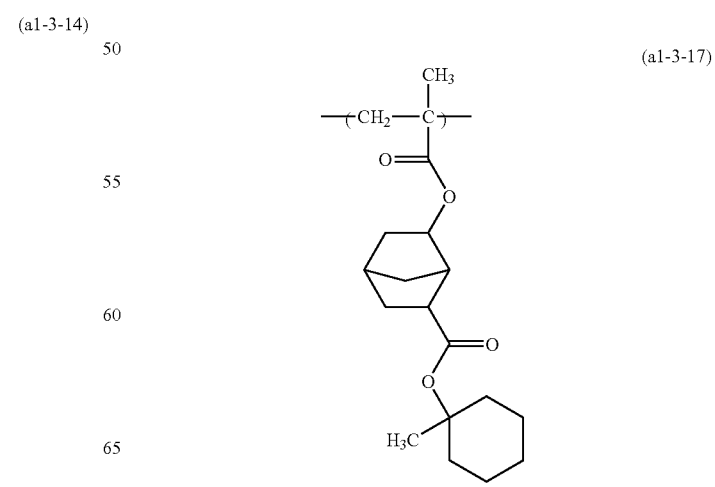
(a1-3-17)

(a1-3-18)
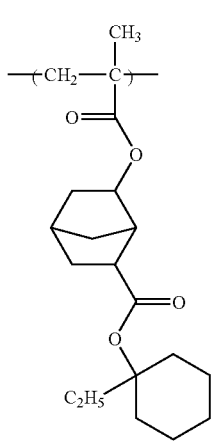
(a1-3-19)
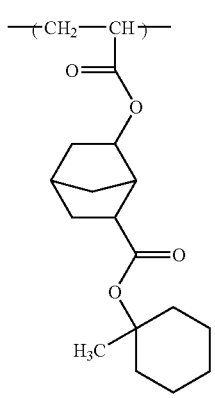
(a1-3-20)
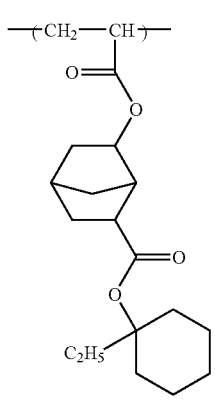
(a1-3-21)
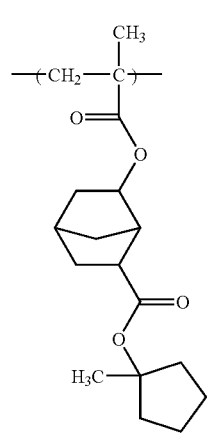
(a1-3-22)
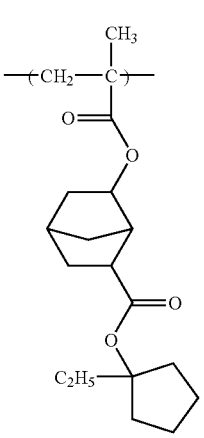
(a1-3-23)
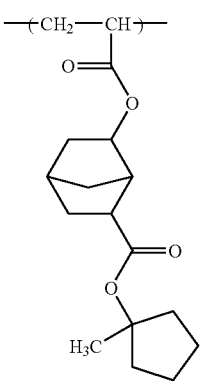
(a1-3-24)
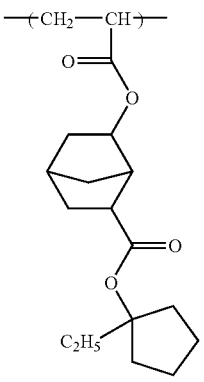
(a1-4-1)
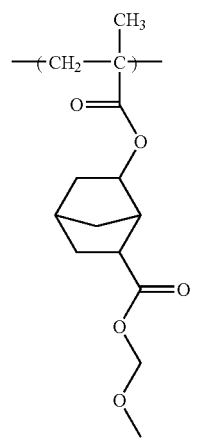

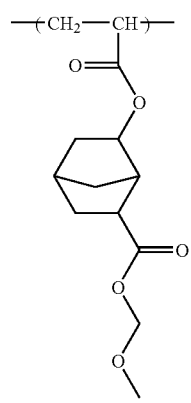 (a1-4-2)
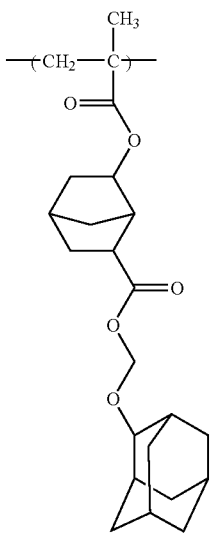 (a1-4-5)
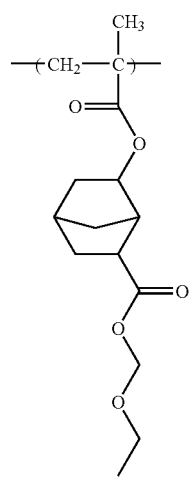 (a1-4-3)
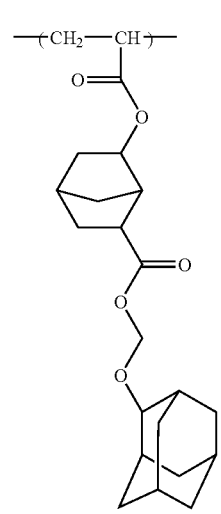 (a1-4-6)
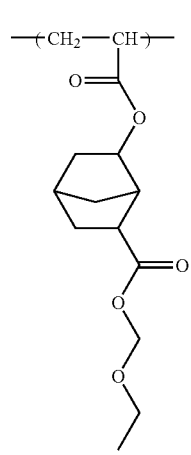 (a1-4-4)
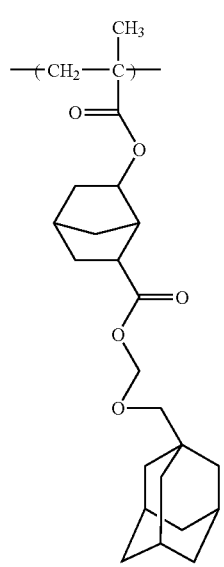 (a1-4-7)

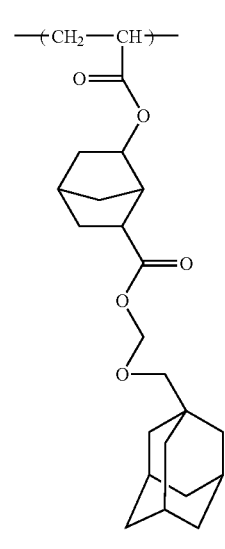
(a1-4-8)
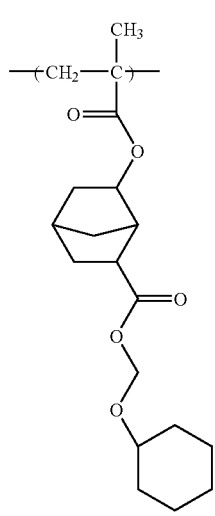
(a1-4-9)
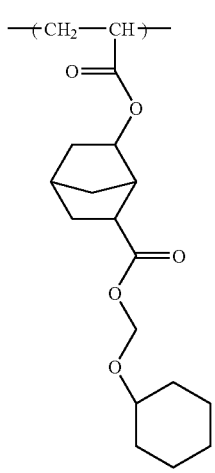
(a1-4-10)
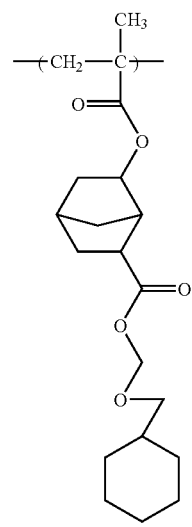
(a1-4-11)
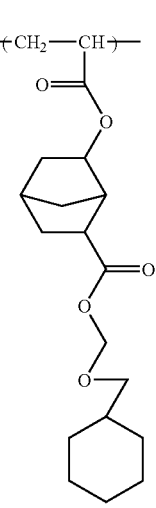
(a1-4-12)
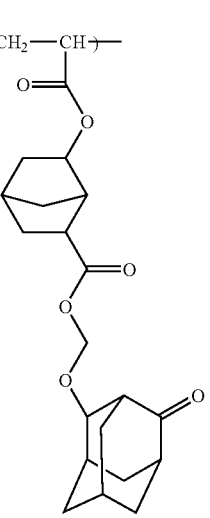
(a1-4-13)

-continued
(a1-4-14)
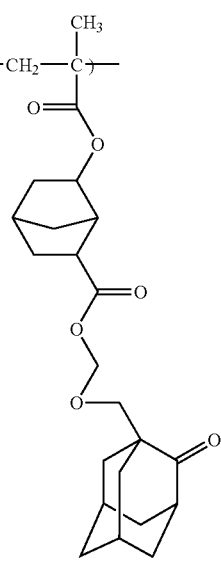
(a1-4-15)
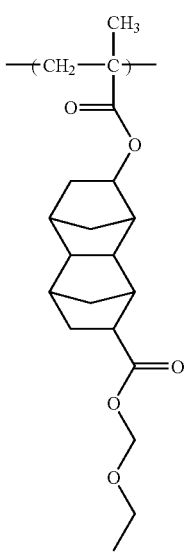
(a1-4-16)
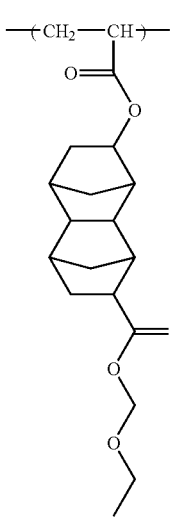
-continued
(a1-4-17)
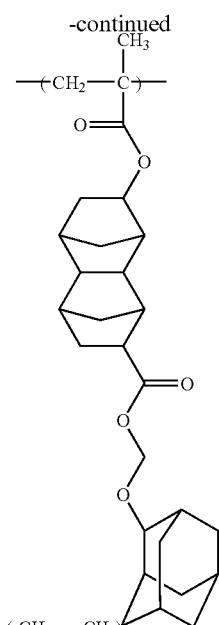
(a1-4-18)
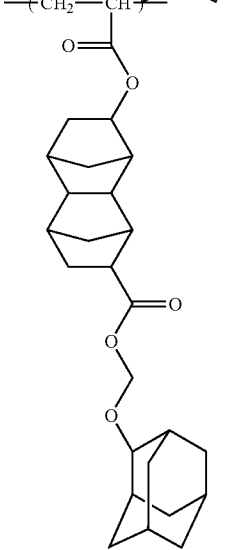
(a1-4-19)
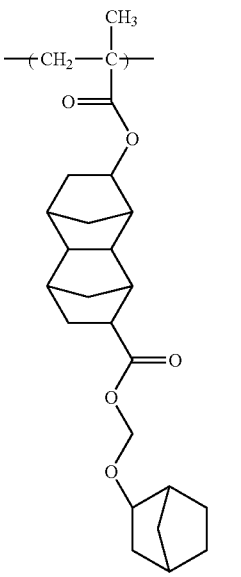

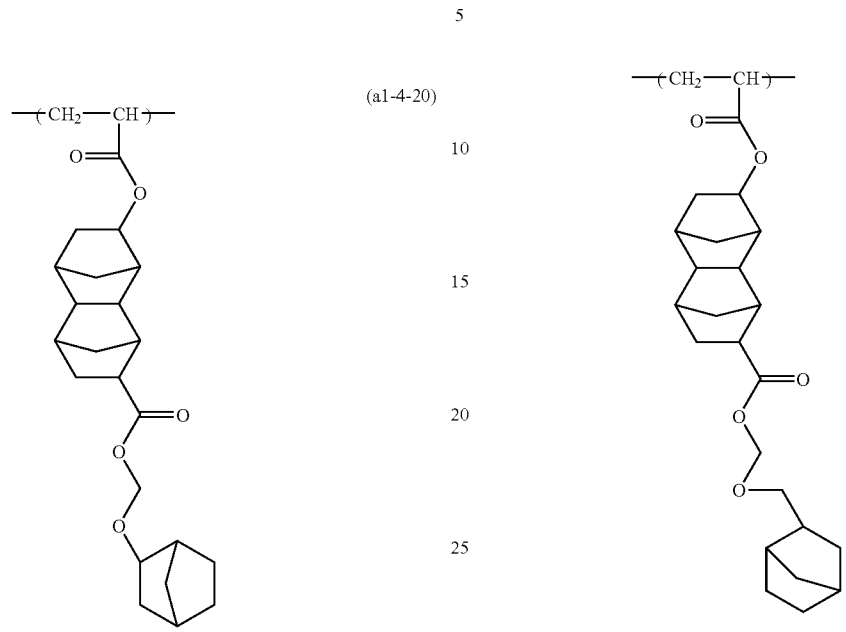
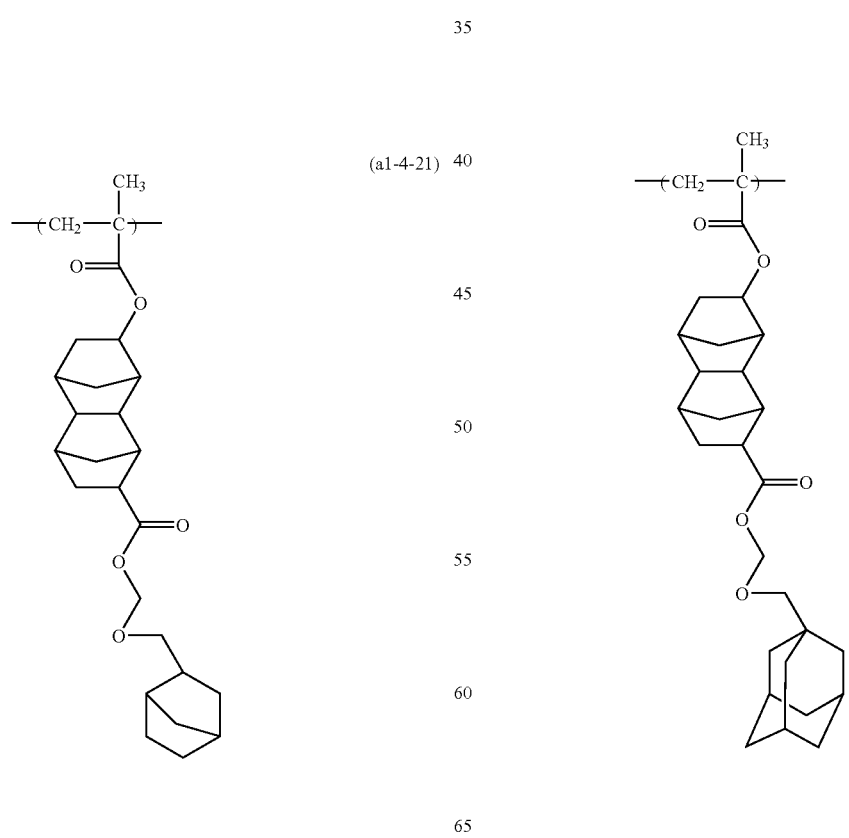

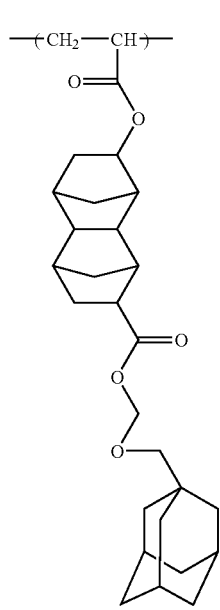 (a1-4-24)
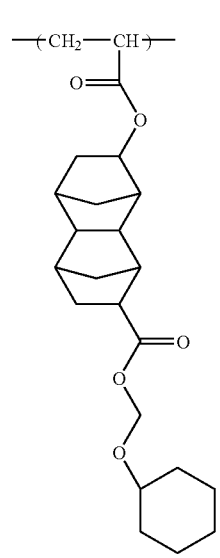 (a1-4-26)
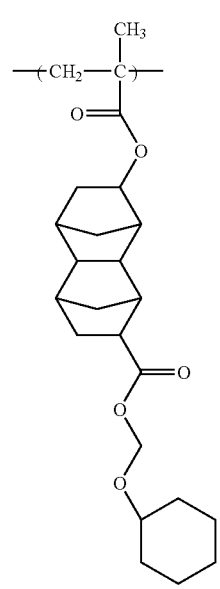 (a1-4-25)
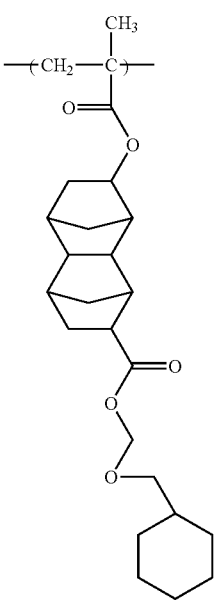 (a1-4-27)

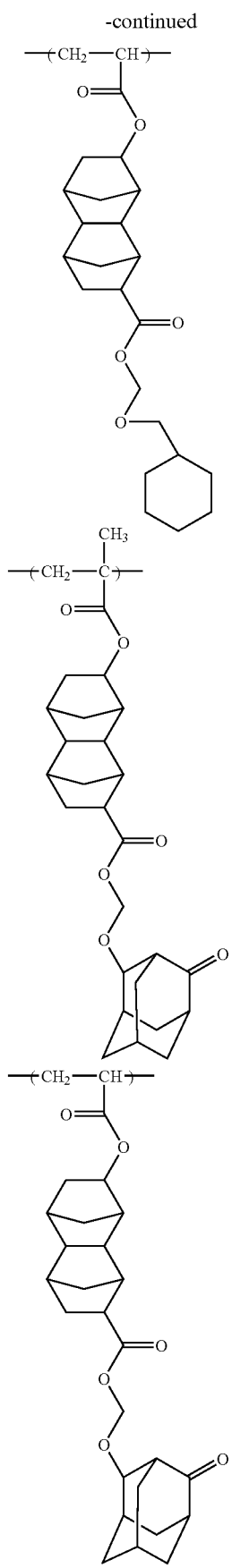

(a1-4-28)

(a1-4-29)

(a1-4-30)

As the structural unit (a1), structural units may be used alone, or two or more kinds of them may be used in combination.

Of the various possibilities, the structural units represented by general formula (a1-1) are preferred. More specifically, the use of at least one structural unit selected from the structural units represented by general formulas (a1-1-1) to (a1-1-6) or (a1-1-35) to (a1-1-41) is more preferred.

As the structural unit (a1), structural units represented by general formula (a1-1-01) including structural units represented by general formulas (a1-1-1) to (a1-1-4), and structural units represented by general formula (a1-0-02) including structural units represented by general formulas (a1-0-35) to (a1-1-41) are also preferred.

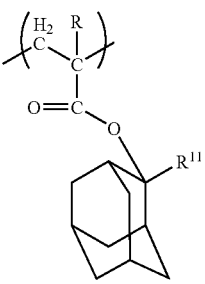

(a1-1-01)

(wherein R represents a hydrogen atom, a halogen atom, a lower alkyl group, or a halogenated lower alkyl group, and $R^{11}$ represents a lower alkyl group)

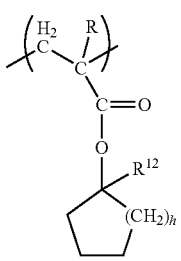

(a1-1-02)

(wherein R represents a hydrogen atom, a halogen atom, a lower alkyl group, or a halogenated lower alkyl group; $R^{12}$ represents a lower alkyl group; and h represents an integer from 1 to 3).

In general formula (a1-0-01), R is the same as R in general formula (a0). The lower alkyl group represented by $R^{11}$ is the same as that represented by R, although a methyl group or an ethyl group is preferable.

In the general formula (a1-0-02), R is the same as R in general formula (a0). The lower alkyl group represented by $R^{12}$ is the same as the lower alkyl group represented by R, and a methyl group or an ethyl group is preferable and an ethyl group is most preferable. h is preferably either 1 or 2, and most preferably 2.

The proportion of the structural unit (a1) in the polymer compound (A1), relative to the entire structural units constituting the polymer compound (A1), is preferably within a range from 10 to 80 mol %, more preferably from 20 to 70 mol %, and still more preferably from 25 to 50 mol %. Ensuring that this proportion is at least as large as the lower limits of the above ranges enables a pattern to be obtained when the polymer compound (A1) is used in a resist composition, whereas ensuring that the proportion is no greater than the upper limits enables a balance to be achieved with the other structural units.

Structural Unit (a3)

The polymer compound (A1) may further contain a structural unit (a3) derived from an acrylate ester containing a polar group-containing aliphatic hydrocarbon group provided the inclusion of this optional resin component does not impair the effects of the present invention. Inclusion of the structural unit (a3) enhances the hydrophilicity of the component (A), thereby improving the affinity with the developing solution, improving the alkali solubility within the exposed portions, and contributing to an improvement in the resolution.

Examples of the polar group in the structural unit (a3) include a hydroxyl group, a cyano group, a carboxyl group, or a hydroxyalkyl group in which a portion of the hydrogen atoms of the alkyl group is substituted with fluorine atoms, of which a hydroxyl group is particularly preferred.

Examples of the aliphatic hydrocarbon group include straight chain or branched chain hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Structural units containing a hydroxyl group, a cyano group, a carboxyl group, or a hydroxyalkyl group in which a portion of the hydrogen atoms of the alkyl group is substituted with fluorine atoms, and are also derived from an acrylate ester are particularly preferred. Examples of suitable polycyclic groups include groups in which one or more hydrogen atoms have been removed from a bicycloalkane, tricycloalkane or tetracycloalkane. Specific examples include groups in which one or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane, or a group in which two or more hydrogen atoms have been removed from tetracyclododecane is preferred industrially.

When the hydrocarbon group in the polar group-containing aliphatic hydrocarbon group is a straight chain or branched chain hydrocarbon group of 1 to 10 carbon atoms, the structural unit (a3) is preferably a structural unit derived from the hydroxyethyl ester of acrylic acid, whereas when the hydrocarbon group is a polycyclic group, structural units represented by formulas (a3-1), (a3-2) and (a3-3) shown below are preferred.

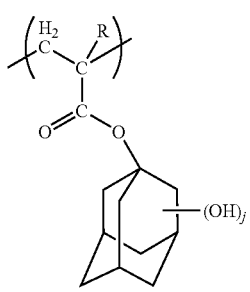
(a3-1)

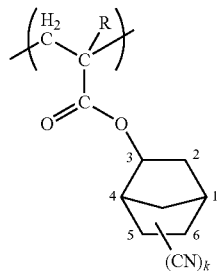
(a3-2)

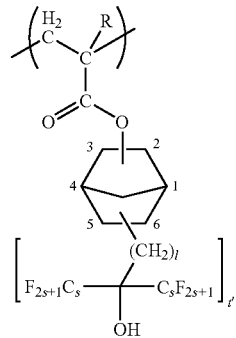
(a3-3)

(wherein R represents a hydrogen atom, a halogen atom, a lower alkyl group, or a halogenated lower alkyl group; j represents an integer from 1 to 3; k represents an integer from 1 to 3; t' represents an integer from 1 to 3; 1 represents an integer from 1 to 5; and s represents an integer from 1 to 3).

In the formula (a3-1), the value of j is preferably 1 or 2, and more preferably 1. When the value of j is 2, structural units in which the hydroxyl group is bonded to the 3-position and the 5-position of the adamantyl group are preferred. When the value of j is 1, structural units in which the hydroxyl group is bonded to the 3-position of the adamantyl group are preferred.

j is preferably 1, and structural units in which the hydroxyl group is bonded to the 3-position of the adamantyl group are particularly preferred.

In the formula (a3-2), the value of k is preferably 1, and structural units in which the cyano group is bonded to either the 5-position or the 6-position of the norbornyl group are preferred.

In the formula (a3-3), the value of t' is preferably 1. The value of 1 is preferably 1 and the value of s is preferably 1. Structural units in which a 2-norbornyl group or a 3-norbornyl group is bonded to the terminal of the carboxyl group of acrylic acid are preferred. Structural units in which a fluorinated alkyl alcohol (hydroxyalkyl group in which a portion of the hydrogen atoms of the alkyl group is substituted with fluorine atoms) is bonded to either the 5-position or the 6-position of the norbornyl group are preferred.

As the structural unit (a3), structural units may be used alone, or two or more kinds of them may be used in combination.

The proportion of the structural unit (a3) in the polymer compound (A1), relative to the entire structural units constituting the polymer compound (A1) is preferably within a range from 5 to 50 mol %, more preferably from 5 to 40 mol %, and most preferably from 5 to 25 mol %.

Structural Unit (a4)

The polymer compound (A1) may also contain another structural unit (a4) besides the structural units (a0), (a1), (a2), (a3), provided the inclusion of this other unit does not impair the effects of the present invention.

As the structural unit (a4), any other structural unit that cannot be classified as one of the above structural units (a0), (a1), (a2), and (a3) can be used without any particular restrictions, and any of the multitude of conventional structural units used in resist resins for ArF excimer lasers or KrF excimer lasers (preferably for ArF excimer lasers) can be used.

As the structural unit (a4), for example, a structural unit derived from an acrylate ester containing a non-acid-dissociable aliphatic polycyclic group is preferred. Examples of this polycyclic group include the same groups as those described above in relation to the aforementioned structural units (a1) and (a3), and any of the multitude of conventional polycyclic groups used in the resin component of resist compositions for ArF excimer lasers or KrF excimer lasers (preferably for ArF excimer lasers) can be used.

In particular, at least one group selected from a tricyclodecanyl group, an adamantyl group, a tetracyclododecanyl group, an isobornyl group, and a norbornyl group is preferred in terms of factors such as industrial availability. These polycyclic groups may also be substituted with a straight chain or branched chain alkyl group of 1 to 5 carbon atoms.

Specific examples of the structural unit (a4) include structures of general formulas (a4-1) to (a4-5) shown below:

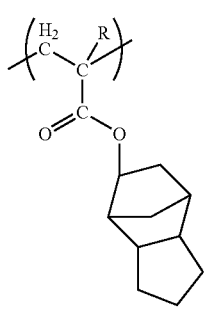
(a4-1)

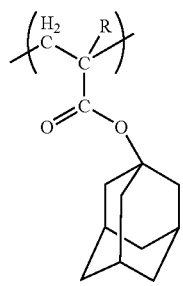
(a4-2)

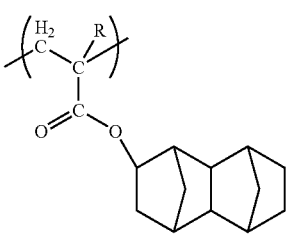
(a4-3)

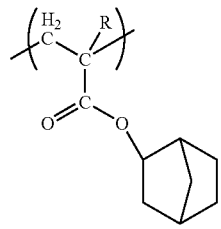
(a4-4)

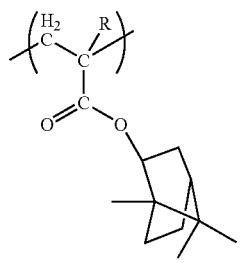
(a4-5)

(wherein R represents a hydrogen atom, a halogen atom, a lower alkyl group, or a halogenated lower alkyl group).

The halogen atom, lower alkyl group or halogenated lower alkyl group represented by R in general formulas (a4-1) to (a4-5) is the same as the halogen atom, lower alkyl group or halogenated lower alkyl group which may be bonded to the α-position of the acrylate ester.

When the structural unit (a4) is included in the polymer compound (A1), the proportion of the structural unit (a4), relative to the entire structural units constituting the polymer compound (A1) is typically within a range from 1 to 30 mol %, and preferably from 10 to 20 mol %.

The polymer compound (A1) is a copolymer containing at least structural units (a0) and (a2), and preferably structural unit (a1), and examples of the copolymer include a copolymer composed of the structural units (a0), (a2) and (a1).

In the present invention, the polymer compound (A1) may preferably contain a combination of structural units represented by formula (A1-11) shown below:

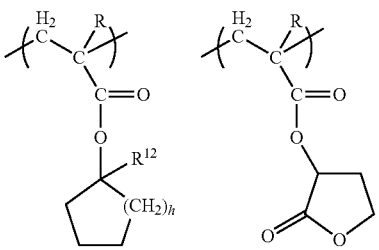
(A1-11)

-continued

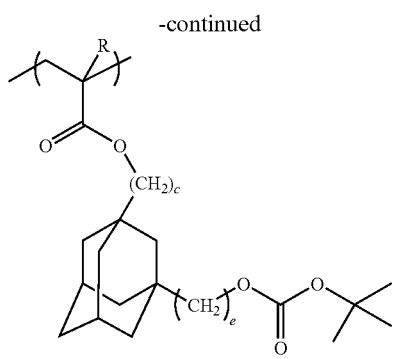

(wherein R represents a hydrogen atom, a halogen atom, a lower alkyl group, or a halogenated lower alkyl group; $R^{12}$ represents a lower alkyl group; c and e each represents, independently, an integer from 0 to 3, and h represents an integer from 1 to 3).

The polymer compound (A1) can be obtained by polymerizing a monomer, from which each structural unit is derived, through known radical polymerization using a radical polymerization initiator such as azobisisobutyronitrile (AIBN).

Also, a —C(CF$_3$)$_2$—OH group may be introduced into the polymer compound (A1) using in combination with a chain transfer agent such as HS—CH$_2$—CH$_2$—CH$_2$—C(CF$_3$)$_2$—OH upon the above polymerization. The copolymer containing a hydroxyalkyl, in which a portion of the hydrogen atoms of an alkyl group have been substituted with a fluorine atom, introduced therein is effective to reduce developing defects and to decrease LER (line edge roughness: heterogeneous irregularity of line side wall).

There are no particular restrictions on the mass average molecular weight (Mw) (the polystyrene equivalent mass average molecular weight determined by gel permeation chromatography) of the polymer compound (A1), and the mass average molecular weight is preferably within a range from 2,000 to 50,000, more preferably from 3,000 to 30,000, and most preferably from 5,000 to 20,000. Ensuring that the mass average molecular weight is smaller than the upper limits of the above ranges enables sufficient solubility in a resist solvent, which is suited for use as a resist, whereas ensuring that the mass average molecular weight is greater than the lower limits of the above ranges enables excellent dry etching resistance and resist pattern profile.

The dispersion degree (Mw/Mn) is preferably from 1.0 to 5.0, more preferably from 1.0 to 3.0, and most preferably from 1.2 to 2.5. Mn is the number average molecular weight.

In the component (A), the polymer compounds (A1) may be used alone, or two or more kinds of them may be used in combination.

In the component (A), the content of polymer compound (A1) is preferably 70% by mass or more, more preferably 80% by mass or more, and most preferably 100% by mass or more.

Component (B)

There are no particular restrictions on the component (B) and it is possible to use acid generators that have conventionally been proposed as an acid generator for chemically amplified photoresists.

As the acid generator, a multitude of acid generators, for example, onium salt-based acid generators such as iodonium salts and sulfonium salts, oxime sulfonate-based acid generators, diazomethane-based acid generators such as bisalkyl or bisarylsulfonyl diazomethanes and poly(bissulfonyl)diazomethanes, nitrobenzylsulfonate-based acid generators, iminosulfonate-based acid generators, and disulfone-based acid generators are known.

As the onium salt-based acid generators, for example, acid generators represented by general formula (b-0) shown below can be preferably used:

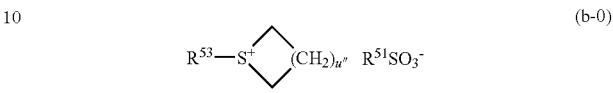 (b-0)

(wherein $R^{51}$ represents a straight chain, branched chain, or cyclic alkyl group, or a straight chain, branched chain, or cyclic fluorinated alkyl group; $R^{52}$ represents a hydrogen atom, a hydroxyl group, a halogen atom, a straight chain, branched chain, or cyclic alkyl group, a straight chain or branched chain halogenated alkyl group, or a straight chain or branched chain alkoxy group; $R^{53}$ represents an aryl group which may include a substituent; and u" represents an integer from 1 to 3).

In general formula (b-0), $R^{51}$ represents a straight chain, branched chain, or cyclic alkyl group, or a straight chain, a branched chain, or cyclic fluorinated alkyl group.

The straight chain or branched chain alkyl group is preferably a straight chain or branched chain alkyl group of 1 to 10 carbon atoms, more preferably 1 to 8 carbon atoms, and most preferably 1 to 4 carbon atoms.

The cyclic alkyl group is preferably a cyclic alkyl group of 4 to 12 carbon atoms, more preferably 5 to 10 carbon atoms, and most preferably 6 to 10 carbon atoms.

The fluorinated alkyl group is preferably a fluorinated alkyl group of 1 to 10 carbon atoms, more preferably 1 to 8 carbon atoms, and most preferably 1 to 4 carbon atoms. The fluorination ratio of the fluorinated alkyl group (the proportion of fluorine atoms, with which hydrogen atoms are substituted, relative to the total number of hydrogen atoms in the alkyl group) is preferably from 10 to 100%, more preferably from 50 to 100%, and groups in which all of the hydrogen atoms have been substituted with fluorine atoms yield the strongest acids, and are consequently the most preferred.

$R^{51}$ is most preferably a straight chain alkyl group or a straight chain fluorinated alkyl group.

$R^{52}$ is a hydrogen atom, a hydroxyl group, a halogen atom, a straight chain, branched chain, or cyclic alkyl group, a straight chain or branched chain halogenated alkyl group, or a straight chain or branched chain alkoxy group.

In $R^{52}$, examples of the halogen atom include a fluorine atom, a bromine atom, a chlorine atom, and an iodine atom, of which a fluorine atom is preferable.

In $R^{52}$, the alkyl group is a straight chain or branched chain and is preferably a group of 1 to 5 carbon atoms, particularly 1 to 4 carbon atoms, and more preferably 1 to 3 carbon atoms.

In $R^{52}$, the cyclic alkyl group is preferably a group of 4 to 12 carbon atoms, more preferably 4 to 10 carbon atoms, and most preferably 5 to 10 carbon atoms.

In $R^{52}$, the halogenated alkyl group is a group in which either a portion of, or all of, the hydrogen atoms in the alkyl group are substituted with a halogen atom. Herein, the alkyl group includes the same "alkyl group" represented by $R^{52}$. The halogen atom to be substituted includes the same groups as those described for the above "halogen atom" represented by $R^{52}$. In the halogenated alkyl group, 50 to 100% of all the hydrogen atoms are preferably substituted with the halogen atom and, more preferably, all the hydrogen atoms are substituted.

In $R^{52}$, the alkoxy group is a straight chain or branched chain alkoxy group and is preferably a group of 1 to 5 carbon atoms, particularly 1 to 4 carbon atoms, and more preferably 1 to 3 carbon atoms.

$R^{52}$ is preferably a hydrogen atom.

$R^{53}$ is an aryl group which may include a substituent and examples of the aryl group having a basic ring (mother ring) structure in which the substituent has been removed include a naphthyl group, a phenyl group, or an anthracenyl group. In view of the effects of the present invention and absorption of exposure light such as an ArF excimer laser, a phenyl group is preferable.

Examples of the substituent include a hydroxyl group or a lower alkyl group (straight chain or branched chain and is preferably of 5 carbon atoms or less, and is particularly preferably a methyl group).

The aryl group represented by $R^{53}$ preferably includes no substituent.

u" is an integer from 1 to 3, preferably 2 or 3, and particularly preferably 3.

Preferred examples of the acid generator represented by general formula (b-0) include the following.

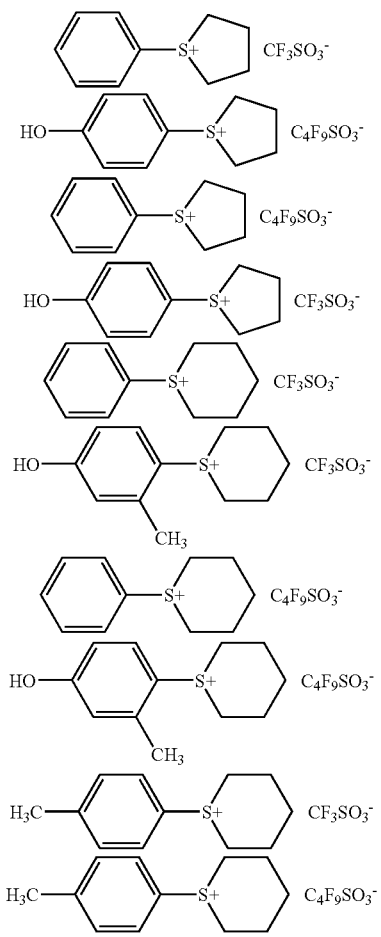

The acid generators represented by general formula (b-0) can be used alone, or two or more kinds of them can be used in combination.

As the onium salt-based acid generator other than the acid generator represented by general formula (b-0), for example, a compound represented by general formula (b-1) or (b-2) shown below is also preferably used:

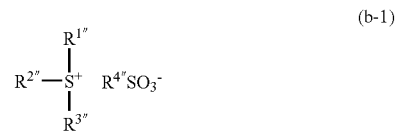

(wherein $R^{1''}$ to $R^{3''}$, and $R^{5''}$ and $R^{6''}$ each represents, independently, an aryl group or an alkyl group; and $R^{4''}$ represents a straight chain, branched, or cyclic alkyl group or fluorinated alkyl group; provided that at least one of $R^{1''}$ to $R^{3''}$ represents an aryl group, and at least one of $R^{5''}$ and $R^{6''}$ represents an aryl group).

In the formula (b-1), $R^{1''}$ to $R^{3''}$ each represents, independently, an aryl group or an alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be substituted with alkyl groups, alkoxy groups, or halogen atoms. In terms of enabling low-cost synthesis, aryl groups of 6 to 10 carbon atoms are preferred. Specific examples of suitable groups include a phenyl group and a naphthyl group.

Alkyl groups which may be used for substitution of the hydrogen atoms of the above aryl groups are preferably alkyl groups of 1 to 5 carbon atoms, and a methyl group, an ethyl group, a propyl group, an n-butyl group or a tert-butyl group is the most preferred.

Alkoxy groups which may be used for substitution of the hydrogen atoms of the above aryl groups are preferably alkoxy groups of 1 to 5 carbon atoms, and a methoxy group or an ethoxy group is the most preferred. Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight chain, branched chain, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, although in terms of achieving excellent resolution and enabling low-cost synthesis, a methyl group is the most preferred.

Of the above possibilities, compounds in which $R^{1''}$ to $R^{3''}$ are all phenyl or naphthyl groups are the most preferred.

The group $R^{4''}$ represents a straight chain, branched chain, or cyclic alkyl group or fluorinated alkyl group.

As the straight chain or branched chain alkyl group, groups of 1 to 10 carbon atoms are preferred, groups of 1 to 8 carbon atoms are more preferred, and groups of 1 to 4 carbon atoms are the most preferred.

Suitable cyclic alkyl groups include the same groups as those listed above in relation to the group $R^{1''}$, and cyclic groups of 4 to 15 carbon atoms are preferred, groups of 4 to 10 carbon atoms are more preferred, and groups of 6 to 10 carbon atoms are the most preferred.

As the above fluorinated alkyl group, groups of 1 to 10 carbon atoms are preferred, groups of 1 to 8 carbon atoms are more preferred, and groups of 1 to 4 carbon atoms are the most preferred. Furthermore, the fluorination ratio of the fluorinated alkyl group (the proportion of fluorine atoms in the alkyl group) is preferably within a range from 10 to 100%, and more preferably from 50 to 100%, and groups in which all of the hydrogen atoms have been substituted with fluorine atoms yield the strongest acids, and are consequently the most preferred.

The group $R^{4''}$ is most preferably a straight chain or cyclic alkyl group, or a fluorinated alkyl group.

In the formula (b-2), $R^{5''}$ to $R^{6''}$ each represents, independently, an aryl group or an alkyl group. At least one of $R^{5''}$ and $R^{6''}$ represents an aryl group. Compounds in which both of $R^{5''}$ and $R^{6''}$ are aryl groups are the most preferred.

Examples of the aryl groups of the groups $R^{5''}$ and $R^{6''}$ include the same aryl groups as those described above for the groups $R^{1''}$ to $R^{3''}$.

Examples of the alkyl groups of the groups $R^{5''}$ and $R^{6''}$ include the same alkyl groups as those described above for the groups $R^{1''}$ to $R^{3''}$.

Of the above possibilities, compounds in which $R^{5''}$ and $R^{6''}$ are all phenyl groups are the most preferred.

Examples of the group $R^{4''}$ in the formula (b-2) include the same as those described above for the group $R^{4''}$ in formula (b-1).

Specific examples of the onium salt-based acid generators represented by (b-1) and (b-2) include diphenyliodonium trifluoromethane sulfonate or nonafluorobutane sulfonate; bis (4-tert-butylphenyl)iodonium trifluoromethane sulfonate or nonafluorobutane sulfonate triphenylsulfonium trifluoromethane sulfonate, heptafluoropropane sulfonate or nonafluorobutane sulfonate; tri(4-methylphenyl)sulfonium trifluoromethane sulfonate, heptafluoropropane sulfonate or nonafluorobutane sulfonate; dimethyl(4-hydroxynaphthyl) sulfonium trifluoromethane sulfonate, heptafluoropropane sulfonate or nonafluorobutane sulfonate; monophenyldimethyl sulfonium trifluoromethane sulfonate, heptafluoropropane sulfonate or nonafluorobutane sulfonate; diphenylmonomethylsulfonium trifluoromethane sulfonate, heptafluoropropane sulfonate or nonafluorobutane sulfonate; (4-methylphenyl)diphenylsulfonium trifluoromethane sulfonate, heptafluoropropane sulfonate or nonafluorobutane sulfonate; (4-methoxyphenyl)diphenylsulfonium trifluoromethane sulfonate, heptafluoropropane sulfonate or nonafluorobutane sulfonate; tri(4-tert-butyl)phenylsulfonium trifluoromethane sulfonate, heptafluoropropane sulfonate or nonafluorobutane sulfonate; and diphenyl(1-(4-methoxy) naphthyl)sulfonium trifluoromethane sulfonate, heptafluoropropane sulfonate or nonafluorobutane sulfonate; di(1-naphthyl)phenylsulfonium trifluoromethane sulfonate, heptafluoropropane sulfonate or nonafluorobutane sulfonate. Furthermore, onium salt acid generators in which the anion portion of the above onium salts has been substituted with a methanesulfonate, n-propanesulfonate, n-butanesulfonate, or n-octanesulfonate can also be used.

Also, acid generators of onium salts in which the anion portion has been substituted with an anion portion represented by general formula (b-3) or (b-4) shown below in general formula (b-1) or (b-2) (the cation portion is the same as in (b-1) or (b-2)) can be used.

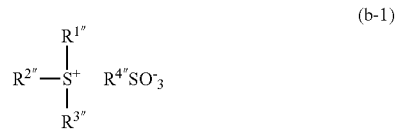

(wherein X" represents an alkylene group of 2 to 6 carbon atoms in which at least one hydrogen atom has been substituted with a fluorine atom; and Y" and Z" each represents, independently, an alkyl group of 1 to 10 carbon atoms in which at least one hydrogen atom has been substituted with a fluorine atom).

The group X" is a straight chain or branched chain alkylene group in which at least one hydrogen atom has been substituted with a fluorine atom, and the number of carbon atoms in the alkylene group is typically within a range from 2 to 6, preferably from 3 to 5, and most preferably 3.

Y" and Z" each represents, independently, a straight chain or branched chain alkyl group in which at least one hydrogen atom has been substituted with a fluorine atom, and the number of carbon atoms in the alkyl group is typically within a range from 1 to 10, preferably from 1 to 7, and most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light or electron beams of 200 nm or less also improves favorably. The fluorine atom proportion within the alkylene groups or alkyl groups, namely the fluorination ratio, is preferably within a range from 70 to 100%, and more preferably from 90 to 100%, and perfluoroalkylene groups or perfluoroalkyl groups in which all of the hydrogen atoms have been substituted with fluorine atoms are the most preferable.

In the present invention, the oxime sulfonate acid-based generator describes a compound that contains at least one structure represented by general formula (B-1) shown below, wherein the compound generates an acid upon irradiation. These types of oxime sulfonate-based acid generators are widely used within chemically amplified resist compositions, and any of these compounds may be selected and used.

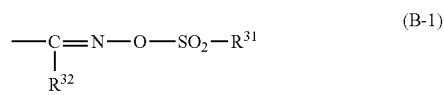

(wherein in formula (B-1), $R^{31}$ and $R^{32}$ each represents, independently, an organic group).

The organic group $R^{31}$ or $R^{32}$ is a group which includes a carbon atom and may include an atom other than a carbon atom (for example, a hydrogen atom, an oxygen atom, a nitrogen atom, a sulfur atom, or a halogen atom (fluorine atom, chlorine atom, or the like)).

The organic group represented by $R^{31}$ is preferably a straight-chain, branched chain, or cyclic alkyl group, or an aryl group. These alkyl group and aryl group may include a substituent. There are no particular restrictions on the substituent and examples include a fluorine atom, and a straight-chain, branched-chain, or cyclic alkyl group of 1 to 6 carbon atoms. Herein, the expression "includes a substituent" means that either a portion of, or all of, the hydrogen atoms of the alkyl group or the aryl group are substituted with the substituent.

The alkyl group is preferably an alkyl group of 1 to 20 carbon atoms, more preferably from 1 to 10 carbon atoms, still more preferably from 1 to 8 carbon atoms, particularly preferably from 1 to 6 carbon atoms, and most preferably from 1 to 4 carbon atoms. The alkyl group is preferably an alkyl group that has been partially or completely halogenated (hereinafter referred sometimes to as a halogenated alkyl group). The expression "alkyl group that has been partially halogenated" refers to an alkyl group in which a portion of the hydrogen atoms are substituted with halogen atoms, whereas the expression "alkyl group that has been completely halogenated" refers to an alkyl group in which all of the hydrogen atoms are substituted with halogen atoms. Examples of the halogen atom include a fluorine atom, a chlorine atom, a bromine atom, and an iodine atom, of which a fluorine atom is particularly preferable. Namely, the halogenated alkyl group is preferably a fluorinated alkyl group.

The aryl group is preferably an aryl group of 4 to 20 carbon atoms, more preferably 4 to 10 carbon atoms, and most preferably 6 to 10 carbon atoms. The aryl group is particularly preferably an aryl group that has been partially or completely halogenated. The expression "aryl group that has been partially halogenated" refers to an aryl group in which a portion of the hydrogen atoms are substituted with halogen atoms, whereas the expression "aryl group that has been completely halogenated" refers to an aryl group in which all of the hydrogen atoms are substituted with halogen atoms.

As $R^{31}$, an alkyl group of 1 to 4 carbon atoms which includes no substituent, or a fluorinated alkyl group of 1 to 4 carbon atoms is particularly preferable.

As the organic group represented by $R^{32}$, a straight chain, branched chain, or cyclic alkyl group, aryl group or cyano group is preferred. Examples of the alkyl group or aryl group represented by $R^{32}$ include the same alkyl group or aryl group exemplified above in relation to the group $R^{31}$.

As $R^{32}$, a cyano group, an alkyl group of 1 to 8 carbon atoms which includes no substituent, or a fluorinated alkyl group of 1 to 8 carbon atoms is particularly preferable.

More preferred oxime sulfonate acid generators include compounds represented by general formula (B-2) or (B-3):

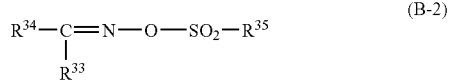

(wherein in formula (B-2), $R^{33}$ is a cyano group, or an alkyl group or a halogenated alkyl group which includes no substituent; $R^{34}$ is an aryl group; and $R^{35}$ is an alkyl group or halogenated alkyl group which includes no substituent).

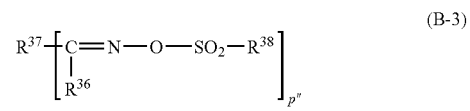

(wherein in formula (B-3), $R^{36}$ is a cyano group, or an alkyl group or a halogenated alkyl group which includes no substituent; $R^{37}$ is a di- or trivalent aromatic hydrocarbon group; $R^{38}$ is an alkyl group or a halogenated alkyl group which includes no substituent; and p" is either 2 or 3).

In general formula (B-2) shown above, the alkyl group or halogenated alkyl group including no substituent group represented by $R^{33}$ is preferably a group of 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

In the fluorinated alkyl group represented by $R^{33}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable.

Examples of the aryl group represented by $R^{34}$ include groups in which one hydrogen atom has been removed from the ring of the aromatic hydrocarbon, such as a phenyl group, a biphenyl group, a fluorenyl group, a naphthyl group, an anthracyl group, and a phenanthryl group; and heteroaryl groups in which a portion of the carbon atoms that form the ring of these groups has been substituted with a hetero atom such as an oxygen atom, a sulfur atom, or a nitrogen atom. Of these groups, a fluorenyl group is preferred.

The aryl group represented by $R^{34}$ may include a substituent such as an alkyl group of 1 to 10 carbon atoms, a halogenated alkyl group, or an alkoxy group. The alkyl group or the halogenated alkyl group in the substituent is preferably a group of 1 to 8, and more preferably 1 to 4 carbon atoms. The halogenated alkyl group is preferably a fluorinated alkyl group.

The alkyl group or halogenated alkyl group represented by $R^{35}$ which includes no substituent is preferably a group of 1 to 10 carbon atoms, more preferably 1 to 8 carbon atoms, and most preferably 1 to 6 carbon atoms.

$R^{35}$ is preferably a halogenated alkyl group, or an alkyl group that has been partially or completely fluorinated.

In the fluorinated alkyl group represented by $R^{35}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable because they increase the strength of the acid that is generated. Completely fluorinated alkyl groups in which 100% of the hydrogen atoms have been substituted with fluorine atoms are the most preferable.

In general formula (B-3) shown above, examples of the alkyl group or halogenated alkyl group represented by $R^{36}$ which includes no substituent include the same alkyl group or halogenated alkyl group represented by $R^{33}$ which includes no substituent.

Examples of the di- or trivalent aromatic hydrocarbon group represented by $R^{37}$ include groups in which one or two hydrogen atoms have been removed furthermore from the aryl group represented by $R^{34}$.

Examples of the alkyl group or halogenated alkyl group represented by $R^{38}$ which includes no substituent include the same alkyl group or halogenated alkyl group represented by $R^{35}$ which includes no substituent.

p" is preferably 2.

Specific examples of the oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Also, oxime sulfonate-based acid generators disclosed in Japanese Unexamined Patent Publication, First Publication No. Hei 9-208554 ([Chemical Formula 18] and [Chemical Formula 19] of paragraphs [0012] to [0014]) and oxime sulfonate-based acid generators disclosed in WO2004/074242A2 (Examples 1 to 40 on pages 65 to 85) can also be preferably used.

Examples of preferred compounds include those shown below.

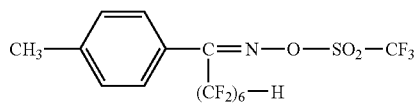

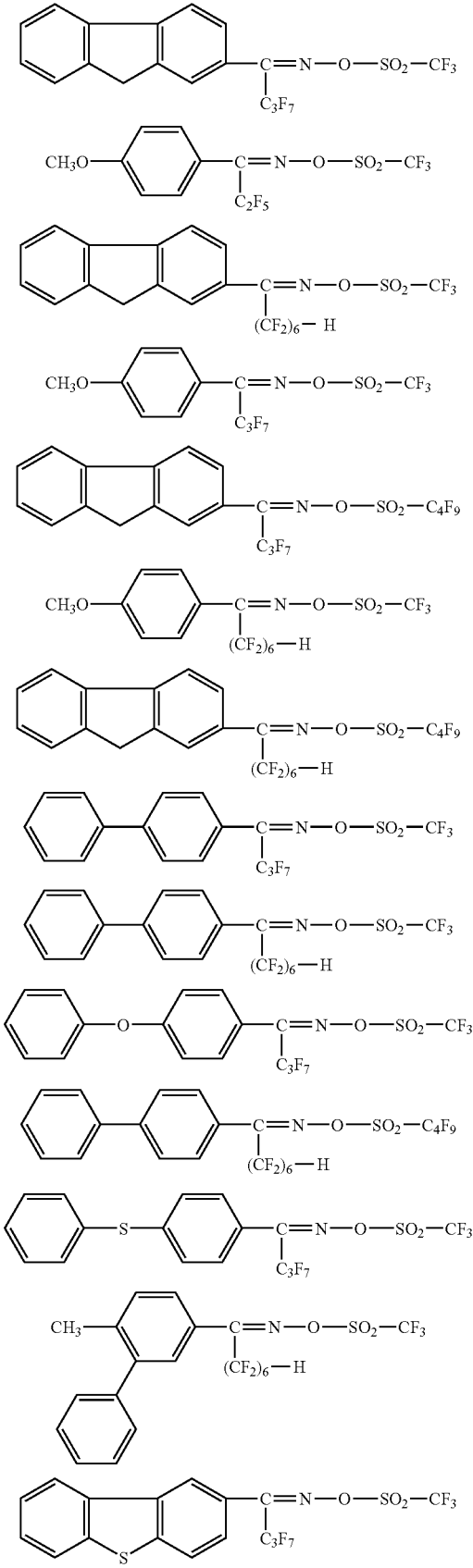

-continued

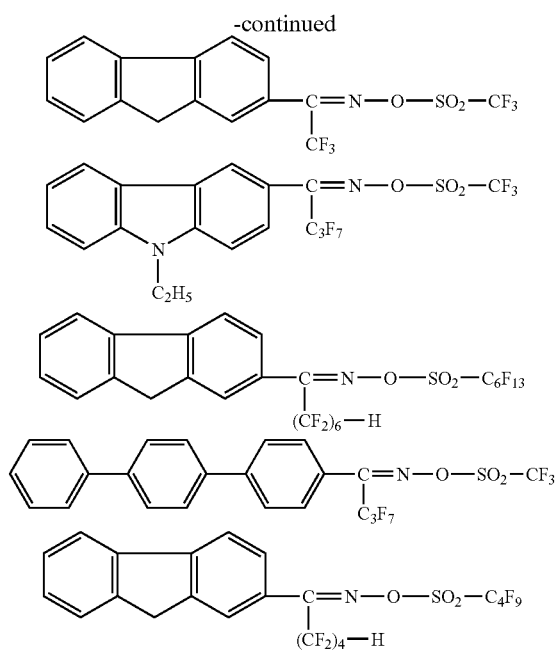

Of the compounds listed above, the four compounds shown below are preferred.

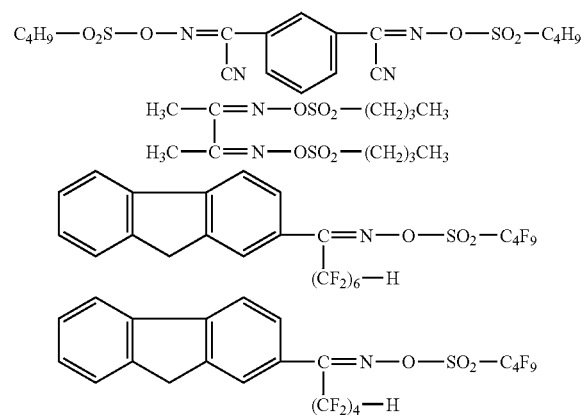

Of the diazomethane acid generators, specific examples of bisalkyl or bisarylsulfonyl diazomethanes include bis(isopropylsulfonyl)diazomethane, bis(p-toluenesulfonyl)diazomethane, b is 1,1-dimethylethylsulfonyl)diazomethane, bis(cyclohexylsulfonyl)diazomethane, and bis(2,4-dimethylphenylsulfonyl)diazomethane.

Also, diazomethane-based acid generators disclosed in Japanese Unexamined Patent Publication, First Publication No. Hei 11-035551, Japanese Unexamined Patent Publication, First Publication No. Hei 11-035552, and Japanese Unexamined Patent Publication, First Publication No. Hei 11-035573 can also be preferably used.

Examples of the poly(bissulfonyl)diazomethanes include 1,3-bis(phenylsulfonyl diazomethylsulfonyl)propane, 1,4-bis(phenylsulfonyl diazomethylsulfonyl)butane, 1,6-bis(phenylsulfonyl diazomethylsulfonyl)hexane, 1,10-bis(phenylsulfonyl diazomethylsulfonyl)decane, 1,2-bis(cyclohexylsulfonyl diazomethylsulfonyl)ethane, 1,3-bis(cyclohexylsulfonyl diazomethylsulfonyl)propane, 1,6-bis(cyclohexylsulfonyl diazomethylsulfonyl)hexane, and 1,10-bis(cyclohexylsulfonyl diazomethylsulfonyl)decane that are disclosed in Japanese Unexamined Patent Publication, First Publication No. Hei 11-322707.

As the component (B), these acid generators may be used alone, or two or more kinds of them may be used in combination.

In the present invention, an onium salt containing a fluorinated alkylsulfonic acid ion as an anion is preferably used as the component (B). Specifically, it is di(1-naphthyl) monophenylsulfonium nonafluorobutanesulfonate.

The content of the entire component (3) in the positive resist composition of the present invention is from 0.5 to 30 parts by mass, and preferably from 1 to 10 parts by mass, based on 100 parts by mass of the component (A). Ensuring that the content is within the above ranges enables sufficient carrying out of pattern formation. It is preferred because a uniform solution is obtained and storage stability is improved.

Component (D)

In the positive resist composition of the present invention, in order to improve the resist pattern shape and the post exposure stability of the latent image formed by the pattern-wise exposure of the resist layer, it is possible to add, as an optional component, a nitrogen-containing organic compound (D) (hereinafter referred to as component (D)).

A multitude of these components (D) have already been proposed, and any of these known compounds may be used, although an aliphatic amine, and particularly a secondary lower aliphatic amine or a tertiary lower aliphatic amine is preferred.

Examples of the aliphatic amine include amines in which at least one of the hydrogen atoms of ammonia ($NH_3$) is substituted with an alkyl group or hydroxyalkyl group of 12 or less carbon atoms (alkylamine or alkyl alcoholamine). Specific examples include a monoalkylamine such as n-hexylamine, n-heptylamine, n-octylamine, n-nonylamine, or n-decylamine; a dialkylamine such as diethylamine, di-n-propylamine, di-n-heptylamine, di-n-octylamine, or dicyclohexylamine; a trialkylamine such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and an alkyl alcoholamine such as diethanolamine, triethanolamine, diisopropanolamine, triisopropanolamine, di-n-octanolamine, or tri-n-octanolamine.

Of these aliphatic amines, an alkylalcoholamine and a trialkylamine are preferred and a trialkylamine is most preferred. Of the trialkylamine, tri-n-pentylamine is most preferred.

These amines may be used alone, or two or more kinds of them may be used in combination.

The component (D) is usually used in an amount within a range from 0.01 to 5.0 parts by mass based on 100 parts by mass of the component (A).

Optional Components

In order to prevent any deterioration in sensitivity and improve the resist pattern shape and the post exposure stability of the latent image formed by the pattern-wise exposure of the resist layer, an organic carboxylic acid, or a phosphorus oxo acid or derivative thereof (E) (hereafter referred to as component (E)) may also be added to the resist composition of the present invention as an optional component.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or ester derivatives thereof such as phosphoric acid, di-n-butyl phosphate and diphenyl phosphate; phosphonic acid or ester derivatives thereof such as phosphonic acid, dimethyl phosphonate, di-n-butyl phosphonate, phenylphosphonic acid, diphenyl phosphonate, and dibenzyl phosphonate; and phosphinic acid or ester derivatives thereof such as phosphinic acid and phenylphosphinic acid, of which phosphonic acid is particularly preferred.

The component (E) is typically used in an amount within a range from 0.01 to 5.0 parts by mass based on 100 parts by mass of the component (A).

Other miscible additives can also be added to the resist composition of the present invention according to need, and examples include additive resins for improving the properties of the resist film, surfactants for improving the coating properties, dissolution inhibitors, plasticizers, stabilizers, colorants, halation prevention agents, and dyes.

The resist composition can be produced by dissolving the materials in an organic solvent (hereinafter referred sometimes to as component (S)).

The component (S) may be any solvent capable of dissolving the various components used to generate a uniform solution, and one or more solvents selected from known materials used as the solvents for conventional chemically amplified resists can be used.

Examples of the solvent include lactones such as γ-butyrolactone;

ketones such as acetone, methyl ethyl ketone, cyclohexanone, methyl n-amyl ketone, methyl isoamyl ketone and 2-heptanone;

polyhydric alcohols such as ethylene glycol, diethylene glycol, propylene glycol and dipropylene glycol, and derivatives thereof;

polyhydric alcohol derivatives including compounds with an ester linkage such as ethylene glycol monoacetate, diethylene glycol monoacetate, propylene glycol monoacetate and dipropylene glycol monoacetate, and compounds with an ether linkage including monoalkyl ethers such as the monomethyl ether, monoethyl ether, monopropyl ether or monobutyl ether, or the monophenyl ether of any of the above polyhydric alcohols or the above compounds with an ester linkage;

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene, and mesitylene.

These organic solvents may be used either alone, or as a mixed solvent containing two or more different solvents.

Of these organic solvents, propylene glycol monomethyl ether acetate (PGMEA), propylene glycol monomethyl ether (PGME) and EL are preferred.

Furthermore, mixed solvents produced by mixing PGMEA with a polar solvent are preferred. Although the mixing ratio (mass ratio) in such mixed solvents can be set in accordance with factors such as the co-solubility of the PGMEA and the polar solvent, the ratio is preferably within a range from 1:9 to 9:1, and more preferably from 2:8 to 8:2.

More specifically, in those cases where EL is added as the polar solvent, the mass ratio PGMEA:EL is preferably within a range from 1:9 to 9:1, and more preferably from 2:8 to 8:2.

More specifically, in those cases where PGME is added as the polar solvent, the mass ratio PGMEA:PGME is preferably within a range from 1:9 to 9:1, more preferably from 2:8 to 8:2, and still more preferably from 3:7 to 7:3.

Furthermore, as the component (S), mixed solvents containing at least one selected from PGMEA and EL, together with γ-butyrolactone, are also preferred. In such cases, the mass ratio of the former and latter components in the mixed solvent is preferably within a range from 70:30 to 95:5.

There are no particular restrictions on the amount of the component (S), although the amount should be set in accordance with the coating film thickness required, at a concentration that enables favorable application of the solution to a substrate or the like. Typically, the amount of solvent is set so that the solid fraction concentration of the resist composition is within a range from 2 to 20% by mass, and preferably from 5 to 15% by mass.

Positive Resist Composition for Thermal Flow

The positive resist composition of the present invention for thermal flow contains a resin component (A) which exhibits increased alkali solubility under the action of an acid (hereinafter referred to as component (A)), and an acid generator component (B) which generates an acid upon exposure (hereinafter referred to as component (B)).

Component (A)

In the present invention, the component (A) contains a polymer compound (A2) containing a structural unit (a0)' represented by general formula (a0)'.

Structural Unit (a0)'

The polymer compound (A2) contains a structural unit (a0)' represented by general formula (a0)'. Inclusion of the structural unit (a0)' decreases the glass transition temperature of the polymer compound (A2) and thus the effects of the present invention are obtained. In the polymer compound (A2), the glass transition temperature decreases and also the decomposition temperature is the same or increases as compared with the resin containing no structural unit (a0)'.

In general formula (a0)', R represents a hydrogen atom, a halogen atom, a lower alkyl group, or a halogenated lower alkyl group. The halogen atom, lower alkyl group or halogenated lower alkyl group is the same as the halogen atom, lower alkyl group or halogenated lower alkyl group which may be bonded to the α-position of the acrylate ester. R is particularly preferably a methyl group.

In general formula (a0)', $Y^1$ represents an aliphatic cyclic group.

Herein, the term "aliphatic cyclic group" is the same as the aliphatic cyclic group represented by $Y^1$ in general formula (a0), preferably a polycyclic group, and particularly preferably group in which two or more hydrogen atoms have been removed from adamantane.

In general formula (a0)', Z' represents an acid dissociable, dissolution inhibiting group.

In the positive resist composition of the present invention, Z' is dissociated by exposure to form a hydrogen atom in the exposed portions, and thus the hydrophilicity of the polymer component (A2) is enhanced, thereby improving the affinity with the developing solution, improving the alkali solubility of the exposed portions, and contributing to an improvement in the resolution.

It is possible to use, as Z', those proposed as an acid dissociable, dissolution inhibiting group of the base resin for a chemically amplified photoresist.

Specific examples thereof include the same acid dissociable, dissolution inhibiting group which has no cyclic structure and contains a chain-like tertiary alkyl group (tertiary alkyloxycarbonyl group, tertiary alkyloxycarbonylalkyl group, branched chain tertiary alkyl group, etc.) and acid dissociable, dissolution inhibiting group containing a tertiary alkyl group having a cyclic structure exemplified above in relation to Z in general formula (a0). It also includes a cyclic or chain-like alkoxyalkyl group.

The cyclic or chain-like alkoxyalkyl group is the same as the group represented by general formula (a1-0-4) of the structural unit (a1).

Of these an acid dissociable, dissolution inhibiting groups (Z'), an acid dissociable, dissolution inhibiting group containing a tertiary alkyl group is preferred. Of these groups, a tertiary alkyloxycarbonyl group is preferable and a tert-butyloxycarbonyl group (t-boc) is more preferable.

In general formula (a0)', a represents an integer from 1 to 3, and preferably 1.

b represents an integer from 0 to 2 and preferably 0.

a+b=1 to 3, and preferably 1.

c represents an, integer from 0 to 3, preferably 0 or 1, and more preferably 0. d represents an integer from 0 to 3, preferably 0 or 1, and more preferably 0. e represents an integer from 0 to 3, preferably 0 or 1, and more preferably 0.

As the structural unit (a0)', a structural unit represented by general formula (a0-1)' shown below is particularly preferred:

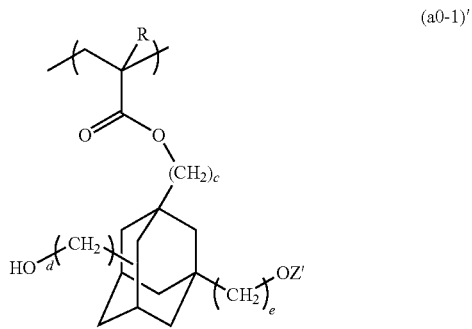

(a0-1)'

(wherein R represents a hydrogen atom, a halogen atom, a lower alkyl group, or a halogenated lower alkyl group; Z' represents an acid dissociable, dissolution inhibiting group; and c, d and e each represents, independently, an integer from 0 to 3).

The monomer from which the structural unit (a0)' is derived can be synthesized, for example, by protecting a hydroxyl group of an aliphatic polycyclic group-containing (meth)acrylate compound containing 1 to 3 alcoholic hydroxyl groups with a protective group containing a tertiary alkyl group using a known technique. The term "(meth)acrylate" means either of, or both, an acrylate and a methacrylate.

In the polymer compound (A2), structural units (a0)' may be used alone, or two or more kinds of them may be used in combination.

The proportion of the structural unit (a0)' in the polymer compound (A2), relative to the entire structural units constituting the polymer compound (A2), is preferably within a range from 10 to 60 mol %, more preferably from 10 to 40 mol %, and most preferably from 15 to 30 mol %. Ensuring that this proportion is at least as large as the lower limits of the above ranges enables the effects obtained by including the structural unit (a0)' to be satisfactorily realized, whereas ensuring that the proportion is no greater than the upper limits enables a more favorable balance to be achieved with the other structural units.

Structural Unit (a2), Structural Unit (a1)

The polymer compound (A2) preferably further contains a structural unit (a2) derived from an acrylate ester containing a lactone-containing cyclic group.

The polymer compound (A2) preferably further contains a structural unit (a1) derived from an acrylate ester containing an acid dissociable, dissolution inhibiting group, which does not correspond to the structural unit (a0)'.

The structural unit (a2) and the structural unit (a1) are the same as structural units (a2) and (a1) (excluding those corresponding to the structural unit (a0)') of the positive resist composition, and therefore an explanation thereof is omitted.

The polymer compound (A2) may further contain other structural units excluding the structural units (a0)', (a2) and (a1). It is possible to use, as other structural units, those which are the same as the structural units (a3) and (a4) of the positive resist composition.

The polymer compound (A2) is a polymer containing at least structural unit (a0)', and preferably a copolymer containing structural units (a2) and/or (a1). Examples of the copolymer include copolymers composed of the structural units (a0)', (a2) and (a1).

In the present invention, those containing a combination of structural units represented by formula (A1-11) are particularly preferred as the polymer compound (A2).

The method for producing the polymer compound (A2), the mass average molecular weight (Mw) and the dispersion degree (Mw/Mn) are the same as in the polymer compound (A1), and therefore an explanation thereof is omitted.

In the component (A), polymer compounds (A2) may be used alone, or two or more kinds may be used in combination.

In the component (A), the content of the polymer compound (A2) is preferably 70% by mass or more, more preferably 80% by mass or more, and most preferably 100% by mass or more.

The component (B) and other components (component (D), optional components) are the same as in the positive resist composition, and therefore an explanation thereof is omitted.

Method for Forming Resist Pattern

The method for forming a resist pattern of the present invention preferably include the steps of forming a resist film on a substrate using the positive resist composition or the positive resist composition for thermal flow of the present invention; exposing the resist film; and developing the resist film to form a resist pattern. The method for forming a resist pattern of the present invention preferably further includes the step of conducting a thermal flow treatment.

The resist pattern forming method of the present invention can be conducted in the following manner.

Namely, the above positive resist composition is first applied on a substrate such as a silicon wafer using a spinner, and prebaking (PAB) is then conducted under temperature conditions of 80 to 150° C., for a period of 40 to 120 seconds, and preferably for 60 to 90 seconds. The resist film thus formed is selectively exposed with an ArF exposure apparatus by irradiating an ArF excimer laser light through a desired mask pattern, and post exposure baking (PEB) is then conducted under temperature conditions of 80 to 150° C., for a period of 40 to 120 seconds, and preferably for 60 to 90 seconds. Subsequently, a developing treatment is conducted using an alkali developing solution such as a 0.1 to 10% by mass aqueous solution of tetramethylammonium hydroxide. In this manner, a resist pattern that is faithful to the mask pattern can be obtained.

It is also possible to form an organic or inorganic anti-reflective film between the substrate and the coating layer of the resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-rays or soft X-ray radiation can be used. The positive resist composition or the positive resist composition for thermal flow of the present invention is particularly effective for use with an ArF excimer laser.

(Thermal Flow Step (Thermal Flow Process))

In the method for forming a resist pattern of the present invention, a thermal flow treatment is further conducted after forming the resist pattern as described above.

The thermal flow treatment can be conducted in the following manner.

Namely, the resist pattern subjected to the development treatment is softened by heating at least one time, preferably 2 to 3 times, thereby allowing the resist to flow, and thus the pattern size (for example, the pore diameter of a hole pattern, or the space width of line&space) of the resist pattern is decreased as compared with the size immediately after the development.

The preferred heating temperature depends on the composition of the resist composition and is not particularly restricted provided that it is not lower than the softening point of the resist pattern, and is preferably within a range from 80 to 180° C., more preferably from 110 to 170° C., and still more preferably from 130 to 170° C. Ensuring that this heating temperature is within the above ranges enables easy control of the pattern size and ease of use in an existing apparatus.

The preferred heating time is not particularly restricted provided that the desired pattern size is obtained without causing any problem in throughput. In a conventional manufacturing process line of a semiconductor device, the heating time is preferably from about 10 to 300 seconds, and more preferably from about 30 to 180 seconds, per one heating.

The positive resist composition suited for thermal flow of the present invention has the effect that it is excellent in controllability of the resist pattern size in a thermal flow process of the resist composition used for ArF excimer laser lithography. The reason is not sure, but is assumed to be as follows.

In the resist composition which has conventionally been used for ArF excimer laser lithography, a resin containing a structural unit containing a polar group-containing aliphatic hydrocarbon group, for example, a structure such as "—$Y^1$ (aliphatic cyclic group)-OH" for the purpose of improving alkali solubility in the exposed portions by enhancing affinity with the developing solution is used.

In the resin containing a structural unit having a structure such as "$Y^1$ (aliphatic cyclic group)-OH", the resist pattern is not sufficiently softened through the heating temperature in the thermal flow process and thus it is difficult to form a resist pattern through thermal flow.

The reason is considered that the resin has a high glass transition temperature, and it is assumed that the glass transition temperature increases through an action of a hydrogen coupling force between "—$Y^1$—OH" as the polar group-containing aliphatic hydrocarbon group in the resin.

The resin used in the present invention contains a structural unit (a0) having a structure such as "—$Y^1$—O—Z (an acid dissociable, dissolution inhibiting group)". It is considered that the glass transition temperature of the resin decreases as compared with the prior art and the resist pattern is sufficiently softened by the thermal flow treatment since the hydrogen coupling force between "—$Y^1$—O—Z" is smaller than the hydrogen coupling force between "—$Y^1$—OH".

It is considered that, in the resist composition, the structure such as "—$Y^1$—O—Z" in the structural unit (a0) enhances hydrophilicity since the exposed portions are converted into "—$Y^1$—OH" through exposure and also enhances affinity with the developing solution, while the unexposed portions are not converted into "—$Y^1$—O—Z", maintained as an alkali-insoluble state. It is assumed that the glass transition temperature of the resin decreases as compared with the prior art by the above reason and the resist pattern composed of the unexposed portions is more sufficiently softened by the thermal flow treatment, and thus a more fine resist pattern can be formed and controllability of the pattern size is improved.

It is considered that when using a resin containing a structural unit (a0)' such as "—$Y^1$—O—Z' (an acid dissociable, dissolution inhibiting group)", the glass transition temperature of the resin decreases as compared with the prior art and the resist pattern is sufficiently softened by the thermal flow treatment since the hydrogen coupling force between" "—$Y^1$—O—Z'" is smaller than the hydrogen coupling force between "—$Y^1$—OH".

It is considered that in the resist composition, the exposed portions of the structure such as "—$Y^1$—O—Z'" in the structural unit (a0)' are converted into "—$Y^1$—OH" through exposure, and thus hydrophilicity is enhanced and affinity with the developing solution is enhanced, while the unexposed portions are not converted into "—$Y^1$—O—Z'", maintained as an alkali-insoluble state. It is assumed that the glass transition temperature of the resin decreases as compared with the prior art by the above reason and the resist pattern composed of the unexposed portions is sufficiently softened by the thermal flow treatment, and thus a more fine resist pattern can be formed and controllability of the pattern size is improved.

The resin used in the present invention has a low glass transition temperature as compared with a conventional resin, and the decomposition temperature is the same or slightly increases. Consequently, in the present invention, the heating temperature of the resist pattern upon the thermal flow treatment can be set to a conventional temperature or a temperature which is lower than the conventional temperature, thus obtaining the effect of having excellent usability such as it is easy to use in an existing apparatus.

In the present invention, good lithography characteristics (resolution, depth of focus (DOF), etc.) are obtained. As a means which enables a resist pattern to easily soften in a thermal flow process, for example, a method of adding an additive such as a monomeric material in a resist composition is proposed.

However, this method has a problem that lithography characteristics deteriorate.

In the present invention, it is not necessary to add the additive in the resist composition since a resist pattern is sufficiently softened by using a resin containing the structural unit (a0) or the structural unit (a0)'. Therefore, it is assumed that good lithography characteristics are obtained.

EXAMPLES

The present invention will now be described by way of examples, but the present invention is not limited by these examples.

Evaluation of Thermal Flow Characteristics

Using compounds 1 to 6 represented by chemical formulas shown below as monomers, copolymers (A)-1 to (A)-3 were synthesized by the following procedures. Also, a method for preparing a compound 1 is described.

COMPOUND 1
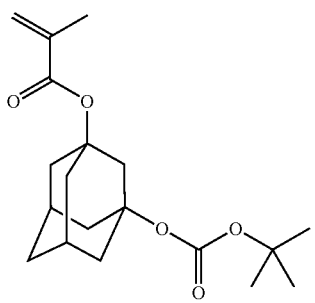

COMPOUND 2
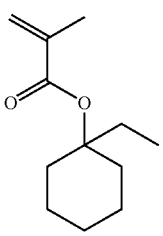

COMPOUND 3
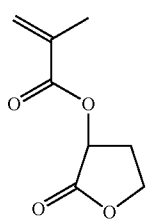

COMPOUND 4
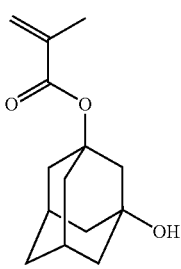

COMPOUND 5
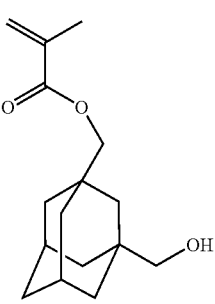

-continued

COMPOUND 6
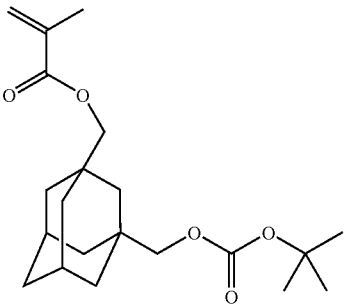

Synthesis Examples

Synthesis of Compound 1

In a recovery flask, 150 mL of THF (tetrahydrofuran) was charged, and then 20 g of 1-(3-hydroxyladamantyl)methacrylate as the compound 4 and 10 g of triethylamine were added. Then, 22 g of t-butoxycarboxylic anhydride was added while ice cooling, followed by stirring at room temperature for 3 hours. The reaction solution was extracted with ethyl acetate and then concentrated to obtain the compound 1.

Synthesis of Compound 6

In a recovery flask, 100 mL of THF was charged, and then 10 g of the compound 5 and 4.6 g of triethylamine were added. Then, 8.0 g of t-butoxycarboxylic anhydride was added while ice cooling, followed by stirring at room temperature for 3 hours. The reaction solution was extracted with ethyl acetate and then concentrated to obtain the compound 6.

$^1$H-NMR (400 MHz, DMSO-d6); σ (ppm)=6.04 (s, 1H, C=CH$_2$), 5.67 (s, 1H, C=CH$_2$), 3.75 (s, 2H, OCH$_2$), 3.66 (s, 2H, OCH$_2$), 1.89 (s, 3H, CH$_3$), 1.59-1.30 (m, 12H, adamantyl CH or CH$_2$), 1.41 (s, 9H, C(CH$_3$)$_3$)

Synthesis of Copolymer (A)-1

In a recovery flask, 250 mL of THF was charged, and then 4 g of the compound 1, 4.5 g of the compound 2 and 4 g of the compound 3 obtained by the syntheses were added.

Then, 0.5 g of a polymerization initiator AIBN (azobisisobutyronitrile) was added, followed by reflux for 6 hours. After the completion of the reaction, the reaction solution was concentrated under reduced pressure and the concentrated solution was added to 0.6 L of heptane. After reprecipitation, the objective copolymer (A)-1 was obtained by filtration and drying under reduced pressure.

The resulting copolymer is shown in chemical formula (A)-1 below.

The mass average molecular weight (Mw) was 10,000, the dispersion degree (Mw/Mn) was 2.0, and the composition ratio (molar ratio) l/m/n was 30/50/20.

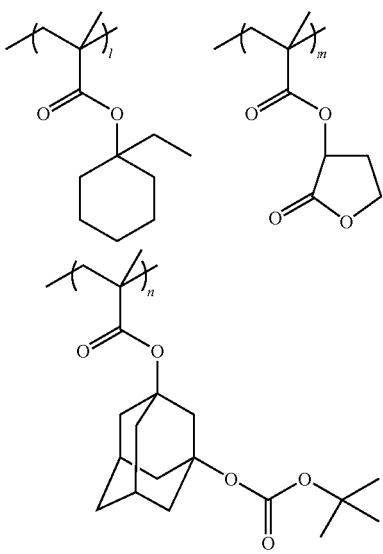

(A)-1

Synthesis of Copolymer (A)-2

In a recovery flask, 250 mL of THF was charged, and then 4 g of the compound 4, 6.4 g of the compound 2 and 5.8 g of the compound 3 were added.

Then, 0.7 g of a polymerization initiator AIBN was added, followed by reflux for 6 hours. After the completion of the reaction, the reaction solution was concentrated under reduced pressure and the concentrated solution was added to 0.6 L of heptane. After reprecipitation, the objective copolymer (A)-2 was obtained by filtration and drying under reduced pressure.

The resulting copolymer is shown in chemical formula (A)-2 below.

The mass average molecular weight (Mw) was 10,000, the dispersion degree (Mw/Mn) was 2.0, and the composition ratio (molar ratio) l/m/n was 30/50/20.

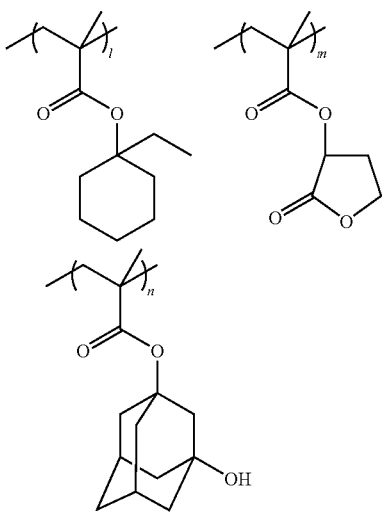

(A)-2

Synthesis of Copolymer (A)-3

In a recovery flask, 200 mL of THF was charged, and then 3.0 g of the compound 6, 3.1 g of the compound 2 and 2.8 g of the compound 3 were added.

Then, 0.3 g of a polymerization initiator AIBN was added, followed by reflux for 6 hours. After the completion of the reaction, the reaction solution was concentrated under reduced pressure and the concentrated solution was added to 0.6 L of heptane. After reprecipitation, the objective copolymer (A)-3 was obtained by filtration and drying under reduced pressure.

The resulting copolymer is shown in chemical formula (A)-3 below.

The mass average molecular weight (Mw) was 10,000, the dispersion degree (Mw/Mn) was 2.0, and the composition ratio (molar ratio) l/m/n was 30/50/20.

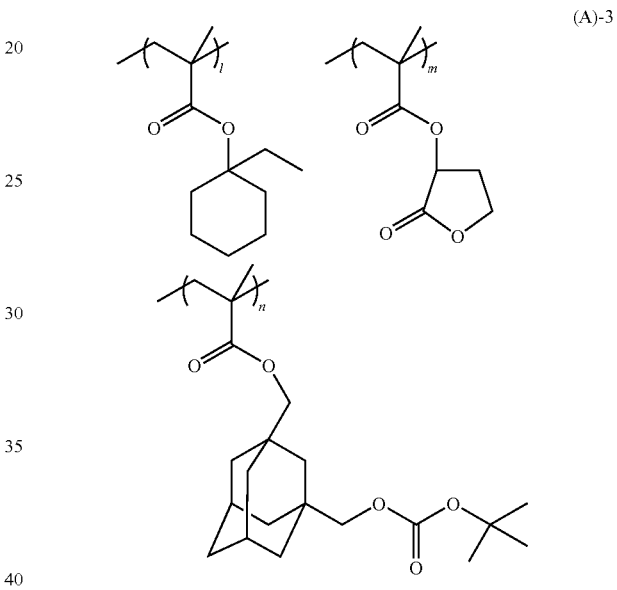

(A)-3

Examples 1 to 2, Comparative Example 1

(Evaluation of Glass Transition Temperature (Tg), Decomposition Temperature (Td))

With respect to the resulting copolymers (A)-1 to (A)-3, the Td was measured at a temperature rise rate of 10° C./min using a thermal analysis equipment DSC6200 (manufactured by Seiko Instrument Co., Ltd. Also, the Tg was measured at a temperature rise rate of 10° C./min using a thermal analysis equipment TG/DTA6200 (manufactured by Seiko Instrument Co., Ltd.). The results are shown in Table 1.

TABLE 1

|  | Copolymer | Tg (° C.) | Td (° C.) |
| --- | --- | --- | --- |
| Example 1 | (A)-1 | 139 | 205 |
| Example 2 | (A)-3 | 133 | 204 |
| Comparative Example 1 | (A)-2 | 164 | 196 |

The results shown in Table 1 revealed that the copolymers (A)-1, (A)-3 of Examples 1 and 2 exhibit a low glass transition temperature and slightly high decomposition temperature as compared with the copolymer (A)-2 of Comparative Example 1.

Example 3, Comparative Example 2

The respective components shown in Table 2 were mixed and then dissolved to prepare positive resist composition solutions.

TABLE 2

|  | Component (A) | Component (B) | Component (D) | Component (S) |
|---|---|---|---|---|
| Example 3 | (A)-1 [100] | (B)-1 [3] | (D)-1 [0.30] | (S)-1 [1,230] |
| Comparative Example 2 | (A)-2 [100] | (B)-1 [3] | (D)-1 [0.30] | (S)-1 [1,230] |

Abbreviations in Table 2 have the following meanings. Also, the numerical value in square brackets indicates the amount (parts by mass).
(A)-1 to (A)-2: Copolymers (A)-1 to (A)-2.
(B)-1: Triphenylsulfonium nonafluorobutanesulfonate
(D)-1: Triethanolamine
(S)-1:PGMEA/PGME=6/4 (mass ratio)

Using the resulting positive resist composition solutions, the following evaluations were conducted.

A material for an organic anti-reflective film (manufactured by Brewer Science, Inc. under the trade name of ARC-29) was applied on an 8 inch silicone wafer and then fired at 205° C. for 60 seconds to form an organic anti-reflective film having a thickness of 77 nm as a substrate.

On the substrate, the positive resist composition obtained above was uniformly applied using a spinner, and then dried by prebaking on a hot plate at 100° C. (PAB temperature) for 60 seconds to form a resist film having a film thickness of 200 nm.

Then, the resulting resist film was selectively exposed to ArF excimer laser (193 nm) through a mask pattern using an ArF exposure apparatus (wavelength: 193 nm) NSR-S302 (trade name, manufactured by Nikon Corporation NA (numerical aperture)=0.60, σ=0.75).

After a PEB treatment was conducted at 100° C. for 90 seconds, the resist film was developed with a developing solution (2.38 wt % aqueous solution of tetramethylammonium hydroxide) at 23° C. for 60 seconds, rinsed with pure water for 15 seconds and shaken dry.

Then, the resist film was dried by heating at 100° C. for 60 seconds to form a resist pattern.

As a result, plural hole patterns having a diameter of 200 nm were obtained.

Evaluation of Controllability of Resist Pattern Size through Thermal Flow Treatment The resulting resist patterns were subjected to a thermal flow treatment under the following temperature conditions and then change in the diameter (nm) of the hole pattern was evaluated.

Example 3: 1) at 155° C. for 90 seconds; 2) at 160° C. for 90 seconds; and 3) at 165° C. for 90 seconds
Comparative Example 2: 1) at 175° C. for 90 seconds; 2) at 180° C. for 90 seconds; and 3) at 185° C. for 90 seconds In the evaluation, a flow rate of a hole pattern having a diameter of 200 nm is shown in the graph of FIG. 1.

The abscissas indicates the temperature (° C.) of a thermal flow treatment, whereas, the ordinate indicates the size (diameter, m) of the diameter of a hole after subjecting to the thermal flow treatment.

The graph of FIG. 1 revealed that, in Example 3 of the present invention, the size of the diameter of the hole changed by the same degree as that in Comparative Example 2 by the thermal flow treatment at a temperature lower than that in Comparative Example 2, thus making it possible to control the resist pattern size.

Evaluation of Lithography Characteristics

Using the positive resist compositions shown below, a line&space resist pattern (hereinafter, sometimes referred to as a L/S pattern) was formed, and then light exposure margin (EL margin) and resolution were evaluated.

Also, a resist pattern (hereinafter, sometimes referred to as a CH pattern) of a contact hole, and then EL margin, mask linearity and depth of focus (DOF) were evaluated. In the CH pattern, controllability of the resist pattern size through the thermal flow treatment was also evaluated.

Example 4, Comparative Examples 3 to 5

The respective components shown in Table 3 were mixed and then dissolved to prepare positive resist composition solutions.

TABLE 3

|  | Component (A) | | Component (B) | Component (D) | Component (E) | Additives | Component (S) |
|---|---|---|---|---|---|---|---|
| Example 4 | (A)-1 [100] | — | (B)-2 [7.0] | (D)-2 [0.29] | (E)-1 [1.18] | — | (S)-1 [1,350] |
| Comparative Example 3 | (A)-4 [100] | — | (B)-2 [7.0] | (D)-2 [0.29] | (E)-1 [1.18] | Add-A [5.0] | (S)-1 [1,350] |
| Comparative Example 4 | (A)-4 [80] | (A)-5 [20] | (B)-2 [7.0] | (D)-2 [0.29] | (E)-1 [1.18] | Add-A [5.0] | (S)-1 [1,350] |
| Comparative Example 5 | (A)-4 [30] | (A)-6 [70] | (B)-2 [7.0] | (D)-2 [0.29] | (E)-1 [1.18] | Add-A [5.0] | (S)-1 [1,350] |

Abbreviations in Table 3 have the following meanings. Also, the numerical value in square brackets indicates the amount (parts by mass).
(A)-1: Copolymer (A)-1
(A)-4 to (A)-6: Copolymers (A)-4 to (A)-6 shown below

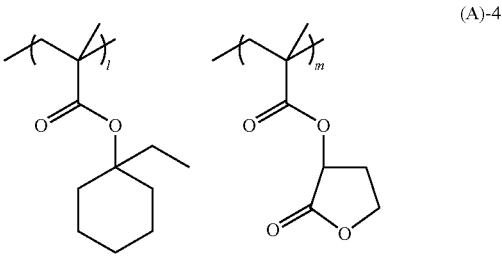

-continued

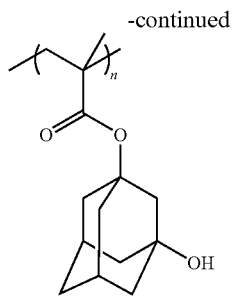

Ratio of structural units l:m:n=40:40:20 (molar ratio), Mw=10,000, Mw/Mn 2.0

(A)-5

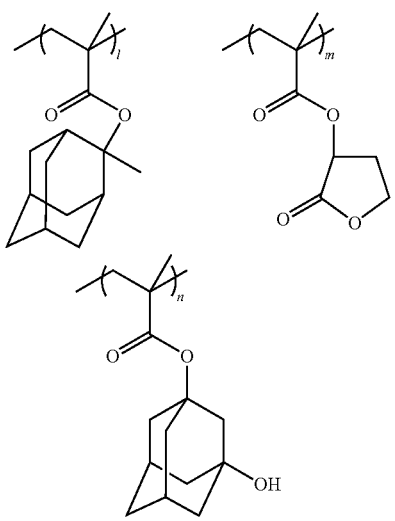

Ratio of structural units l:m:n=30:50:20 (molar ratio), Mw=10,000, Mw/Mn=2.0

(A)-6

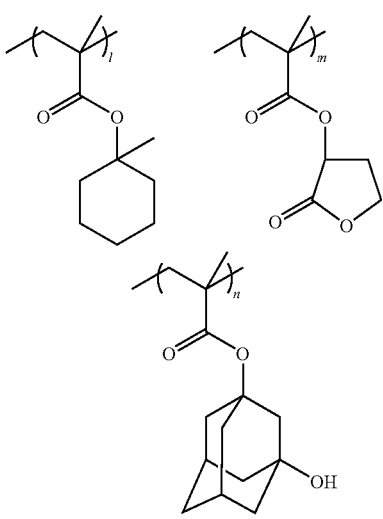

Ratio of structural units l:m:n=40:40:20 (molar ratio), Mw=10,000, Mw/Mn=2.0

(B)-2: Di 1-naphthyl)monophenylsulfonium nonafluorobutanesulfonate
(D)-2: Tri-n-pentylamine
(E)-1: Salicylic acid
Add-A: Lithocholic acid
(S)-1:PGMEA/PGME=6/4 (mass ratio)

Using the resulting positive resist composition solutions, the following evaluations were conducted.

Evaluation in Line&Space (L/S) Pattern

An organic anti-reflective film composition "AR46" (trade name, manufactured by Rohm and Haas Company) was applied on an 8 inch silicone wafer using a spinner, and then dried by firing on a hot plate at 215° C. for 60 seconds to form an organic anti-reflective film having a thickness of 29 nm.

On the anti-reflective film, the positive resist composition solution obtained above was applied using a spinner, and then dried by prebaking on a hot plate at the PAB temperature shown in Table 4 for 60 seconds to form a resist film having a film thickness of 200 nm.

Then, the resulting resist film was selectively exposed to ArF excimer laser (193 nm) through a mask pattern (half tone) using an ArF exposure apparatus NSR-S306D (trade name, manufactured by Nikon Corporation NA (numerical aperture) 0.78, Y-Dipole).

After a post exposure baking (PEB) treatment was conducted at the PEB temperature shown in Table 4 for 60 seconds, developed for 60 seconds in a 2.38% by weight aqueous solution of tetramethylammonium hydroxide (TMAH) at 23° C., rinsed with pure water for 30 seconds and then postbaked at 100° C. for 60 seconds to form a line&space resist pattern.

Evaluation of EL Margin (Light Exposure Margin)

Optimum light exposure (Eop) (unit: mJ/cm$^2$ (energy amount)) upon formation of an L/S pattern having a line width of 80 nm and a pitch of 160 nm was determined.

The resulting L/S pattern was observed by measuring SEM (manufactured by Hitachi, Ltd. under the trade name of "S-9220"), thus determining what percentage of Eop determined above the light exposure capable of forming each pattern at the size within a target size ±10% accounts for (EL margin).

The larger the value of the EL margin, the smaller the change in the pattern size with variation of the light exposure. The results are shown in Table 4.

Evaluation of Resolution

In the Eop, by changing a pattern size to 140 nm, 130 nm, 120 nm, 110 nm, 100 nm or 90 nm (pattern in which the ratio of line&space is 1:1), or 80 nm (pattern in which the ratio of line&space is 1:1, 1.2:1 or 1.5:1, namely, pattern in which the line width increases at a fixed space width), a minimum size (nm) and L/S ratio of the pattern to be resolved. The results are shown in Table 4.

TABLE 4

| | PAB (° C.) | PEB (° C.) | Eop (mJ/cm$^2$) | EL margin (mJ/cm$^2$) | Resolution (nm), L/S ratio |
|---|---|---|---|---|---|
| Example 4 | 110 | 100 | 40.5 | 12.22 | 80 (1.5:1) |
| Comparative Example 3 | 115 | 105 | 40.5 | 11.44 | 80 (1.2:1) |
| Comparative Example 4 | 115 | 105 | 43.0 | 12.17 | 80 (1.2:1) |
| Comparative Example 5 | 115 | 105 | 53.5 | 10.66 | 80 (1.2:1) |

The results shown in Table 4 revealed that the EL margin of Example 4 is the same as or better than that of Comparative Examples 3 to 5, and Example 4 is excellent in EL margin.

It was also revealed that Example 4 is excellent in resolution since it is excellent in proximity effect as compared with Comparative Examples 3 to 5.

It was also revealed that the resist pattern shape of Example 4 is the same as that of Comparative Examples 3 to 5, and Example 4 is excellent in resist pattern shape.

Using the resulting positive resist composition solutions, the following evaluations were conducted.

Evaluation in Contact Hole (CH) Pattern

An organic anti-reflective film composition "AR46" (trade name, manufactured by Rohm and Haas Company) was applied on an 8 inch silicone wafer using a spinner, and then dried by firing on a hot plate at 215° C. for 60 seconds to form an organic anti-reflective film having a thickness of 29 nm.

On the anti-reflective film, the positive resist composition solution obtained above was applied using a spinner, and then dried by prebaking (PAB) on a hot plate at the PAB temperature shown in Table 5 for 60 seconds to form a resist film having a thickness of 200 nm.

Then, the resulting resist film was selectively exposed to ArF excimer laser (193 nm) through a mask pattern using an ArF exposure apparatus NSR-S306D (trade name, manufactured by Nikon Corporation NA (numerical aperture)=0.78, ⅔ annular illumination).

After a post exposure baking (PEB) treatment was conducted at the PEB temperature shown in Table 5 for 60 seconds, developed for 60 seconds in a 2.38% by weight aqueous solution of tetramethylammonium hydroxide (TMAH) at 23° C., rinsed with pure water for 30 seconds and then postbaked at 100° C. for 60 seconds to form a contact hole (CH) pattern.

Sensitivity

Optimum light exposure (Eop) (unit: mJ/cm$^2$) upon formation of a 100 nm CH pattern having a pitch of 200 nm was determined. The results are shown in Table 5.

Evaluation of Depth of Focus (DOF)

A CH pattern was formed by appropriately shifting the focus while maintaining light exposure at Eop (mJ/cm$^2$) obtained above, and then the depth (nm) of the focus (DOF) at which a hole pattern is formed was determined. The results are shown in Table 5.

TABLE 5

| | PAB (° C.) | PEB (° C.) | Eop (mJ/cm$^2$) | DOF (nm) |
|---|---|---|---|---|
| Example 4 | 110 | 100 | 49.0 | 800 |
| Comparative Example 3 | 115 | 105 | 53.5 | 600 |
| Comparative Example 4 | 115 | 105 | 57.0 | 600 |
| Comparative Example 5 | 115 | 105 | 66.0 | 600 |

The results shown in Table 5 revealed that Example 4 is excellent in DOF as compared with Comparative Examples 3 to 5.

It was also revealed that the EL margin of Example 4 is the same as or better than that of Comparative Examples 3 to 5, and Example 4 is excellent in EL margin, since when the change in the diameter of a hole (nm) with light exposure (mJ/cm$^2$) is plotted in a graph (abscissas: light quantity, ordinate: diameter of hole), the graph shows small inclination.

It was also revealed that mask reproducibility of Example 4 is the same as or better than that of Comparative Examples 3 to 5, and Example 4 is excellent in mask linearity.

Evaluation of Controllability of Resist Pattern Size Through Thermal Flow Treatment With respect to the contact hole (CH) patterns obtained above, a thermal flow treatment was conducted under the following temperature conditions, and then change in the diameter of the hole (nm) was evaluated.

1) at 100° C. for 90 seconds; 2) at 145° C. for 90 seconds

The evaluation revealed that the diameter of the hole changed from 190.8 nm to 156.6 nm in Example 4 through the thermal flow treatment, and thus the resist pattern size is controlled.

In contrast, a change in the diameter of the hole was not recognized in Comparative Examples 3 to 5.

The above results revealed that Example 4 containing the component (A) according to the present invention is excellent in controllability of the resist pattern size in a thermal flow process. It was also revealed that Example 4 according to the present invention is also excellent in lithography characteristics, although additives are not added.

INDUSTRIAL APPLICABILITY

The present invention can provide a positive resist composition which is suited for thermal flow having excellent controllability of a resist pattern size in a thermal flow process using a resist composition used in ArF excimer laser lithography, and a method for forming a resist pattern.

The invention claimed is:

1. A positive resist composition comprising a resin component (A) which exhibits increased alkali solubility under an action of an acid, and an acid generator component (B) which generates an acid upon exposure, wherein the resin component (A) contains a polymer compound (A1) containing a structural unit (a0) represented by general formula (a0) shown below:

$$
\begin{array}{c}
\left[\begin{array}{c}
\mathrm{H_2}\\
\mathrm{C}
\end{array}\!\!-\!\!\begin{array}{c}
\mathrm{R}\\
\mathrm{C}
\end{array}\right]\\
\mathrm{O}\!=\!\mathrm{C}\!-\!\mathrm{O}\\
|\\
(\mathrm{CH_2})_c\\
|\\
\mathrm{Y}^1\!\!-\!\![(\mathrm{CH_2})_e\!-\!\mathrm{OZ}]_a\\
|\\
(\mathrm{CH_2})_d\\
|\\
\mathrm{OH}
\end{array}\bigg]_b
\quad (\mathrm{a0})
$$

(wherein R represents a hydrogen atom, a halogen atom, a lower alkyl group, or a halogenated lower alkyl group; $Y^1$ represents an aliphatic cyclic group; Z represents an acid dissociable, dissolution inhibiting group containing a tertiary alkyl group; a represents an integer from 1 to 3, b represents an integer from 0 to 2, and a+b=1 to 3; c, d and e each represents, independently, an integer from 0 to 3), and a structural unit (a2) derived from an acrylate ester containing a lactone-containing cyclic group.

2. The positive resist composition according to claim 1, wherein the polymer compound (A1) further contains a structural unit (a1) derived from an acrylate ester containing an acid dissociable, dissolution inhibiting group, which does not correspond to the structural unit (a0).

3. The positive resist composition according to claim 1, which is used for a thermal flow process.

4. A positive resist composition for thermal flow, comprising a resin component (A) which exhibits increased alkali solubility under an action of an acid, and an acid generator component (B) which generates an acid upon exposure, wherein the resin component (A) contains a polymer compound (A2) containing a structural unit (a0)' represented by general formula (a0)' shown below:

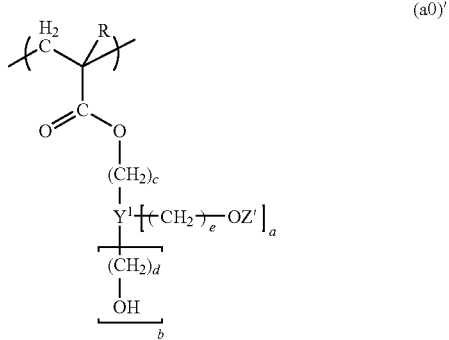

(a0)'

(wherein R represents a hydrogen atom, a halogen atom, a lower alkyl group, or a halogenated lower alkyl group; $Y^1$ represents an aliphatic cyclic group; Z' represents an acid dissociable, dissolution inhibiting group; a represents an integer from 1 to 3, b represents an integer from 0 to 2, and a+b=1 to 3; and c, d and e each represents, independently, an integer from 0 to 3].

5. The positive resist composition according to claim 1, further comprising a nitrogen-containing organic compound (D).

6. The positive resist composition for thermal flow according to claim 4, further comprising a nitrogen-containing organic compound (D).

7. A method for forming a resist pattern, comprising the steps of forming a resist film on a substrate using the positive resist composition according to claim 1; exposing the resist film; developing the resist film to form a resist pattern; and conducting a thermal flow treatment.

8. A method for forming a resist pattern, comprising the steps of forming a resist film on a substrate using the positive resist composition for thermal flow according to claim 4; exposing the resist film; developing the resist film to form a resist pattern; and conducting a thermal flow treatment.

* * * * *